(12) United States Patent
Takakura et al.

(10) Patent No.: US 11,016,045 B2
(45) Date of Patent: May 25, 2021

(54) INVERTER DEVICE AND METHOD FOR DETECTING HEAT DISSIPATION CHARACTERISTICS OF INVERTER DEVICE

(71) Applicant: KABUSHIKI KAISHA TOSHIBA, Tokyo (JP)

(72) Inventors: Shinji Takakura, Kanagawa (JP); Shigen Yasunaka, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 356 days.

(21) Appl. No.: 16/110,724

(22) Filed: Aug. 23, 2018

(65) Prior Publication Data
US 2019/0187081 A1 Jun. 20, 2019

(30) Foreign Application Priority Data
Dec. 18, 2017 (JP) .............................. JP2017-241938

(51) Int. Cl.
| | |
|---|---|
| *G01N 25/00* | (2006.01) |
| *G01K 7/00* | (2006.01) |
| *G01N 25/18* | (2006.01) |
| *H02P 27/08* | (2006.01) |
| *H05K 7/20* | (2006.01) |
| *H02M 7/00* | (2006.01) |
| *H02M 7/5387* | (2007.01) |
| *H02M 1/088* | (2006.01) |
| *H02M 1/32* | (2007.01) |

(52) U.S. Cl.
CPC ............ *G01N 25/18* (2013.01); *H02M 7/003* (2013.01); *H02M 7/53871* (2013.01); *H02P 27/08* (2013.01); *H05K 7/209* (2013.01); *H05K 7/20945* (2013.01); *H02M 1/088* (2013.01); *H02M 2001/327* (2013.01)

(58) Field of Classification Search
USPC .................................. 374/43, 100, 178, 163
See application file for complete search history.

(56) References Cited

U.S. PATENT DOCUMENTS

| | | |
|---|---|---|
| 8,027,132 B2 | 9/2011 | Omaru |
| 8,680,884 B2 | 3/2014 | Chobot |
| 2003/0076232 A1 | 4/2003 | Sato et al. |

(Continued)

FOREIGN PATENT DOCUMENTS

| | | |
|---|---|---|
| JP | H5-39196 U | 5/1993 |
| JP | 3668708 B2 | 7/2005 |

(Continued)

*Primary Examiner* — Mirellys Jagan
(74) *Attorney, Agent, or Firm* — Finnegan, Henderson, Farabow, Garrett & Dunner L.L.P.

(57) ABSTRACT

According to one embodiment, an inverter device configured to be capable of switching an on or off state of each of a plurality of switching elements, on the basis of a control command signal, and operable as a single-phase inverter, includes: a pulse width modulator configured to set a voltage value at a time when one of the switching elements is set to the on state to a first voltage, and set a voltage value at a time when the other three of the switching elements are set to the on state to a second voltage larger than the first voltage, in operation as the single-phase inverter; and a detection unit configured to detect the control command signal in operation as the single-phase inverter.

19 Claims, 14 Drawing Sheets

(56) References Cited

U.S. PATENT DOCUMENTS

| | | | |
|---|---|---|---|
| 2015/0016063 A1* | 1/2015 | Higuma | H05K 7/209 |
| | | | 361/714 |
| 2016/0093788 A1* | 3/2016 | Matsumoto | H05K 7/20336 |
| | | | 136/212 |
| 2017/0003337 A1 | 1/2017 | Bito et al. | |
| 2017/0170744 A1* | 6/2017 | Kouno | H02M 7/217 |
| 2020/0067502 A1* | 2/2020 | Hiyama | H02M 7/48 |
| 2020/0091854 A1* | 3/2020 | Tatewaki | H02M 7/53873 |
| 2020/0295696 A1* | 9/2020 | Takenaka | H02P 25/022 |
| 2020/0304053 A1* | 9/2020 | Ue | H02P 27/08 |

FOREIGN PATENT DOCUMENTS

| | | |
|---|---|---|
| JP | 2010-220470 A | 9/2010 |
| JP | 2014-236538 A | 12/2014 |
| JP | 2016-5289 A | 1/2016 |
| JP | 5963860 B2 | 8/2016 |
| JP | 2017-17822 A | 1/2017 |

\* cited by examiner

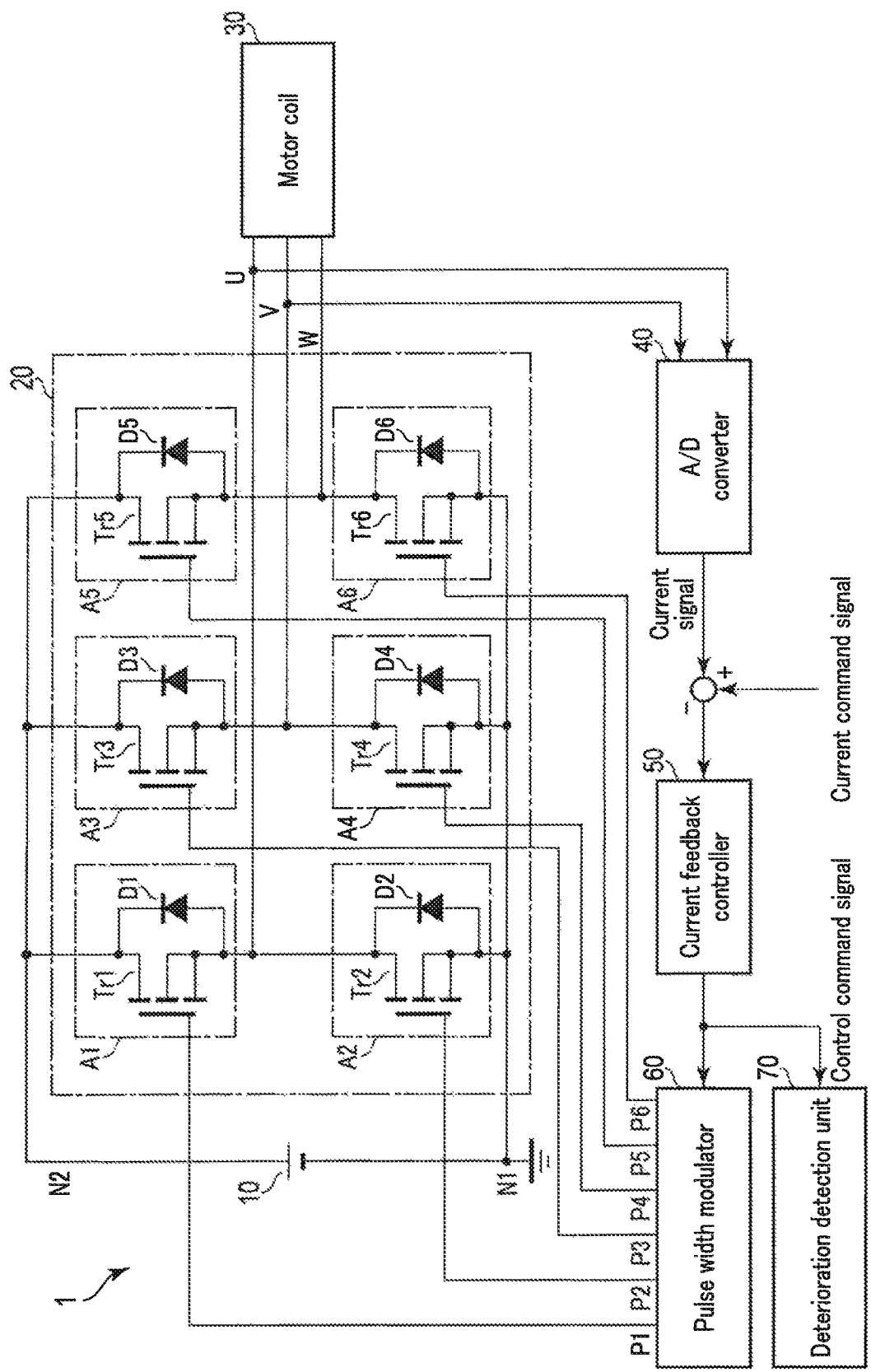
F I G. 1

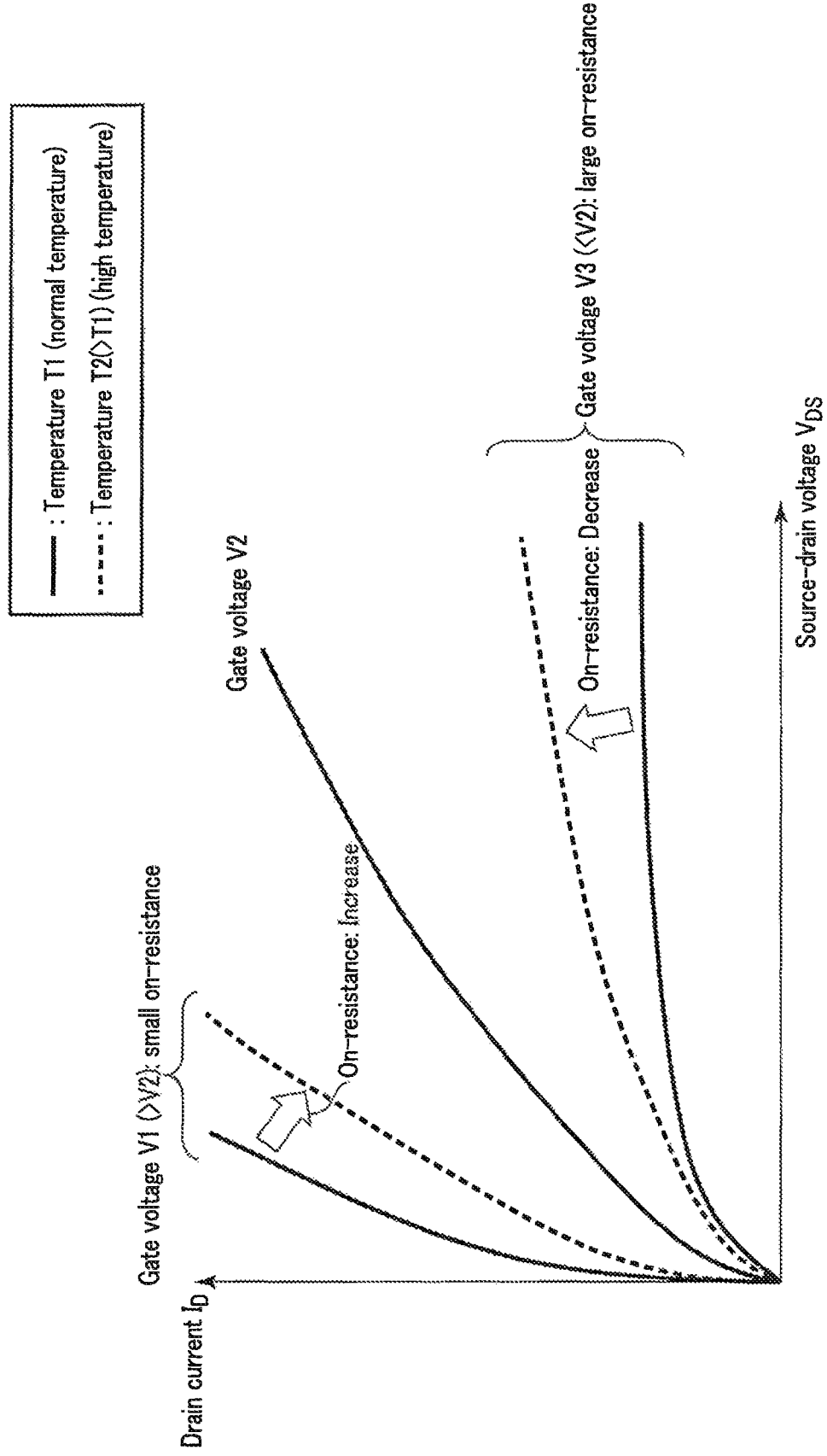
F I G. 3

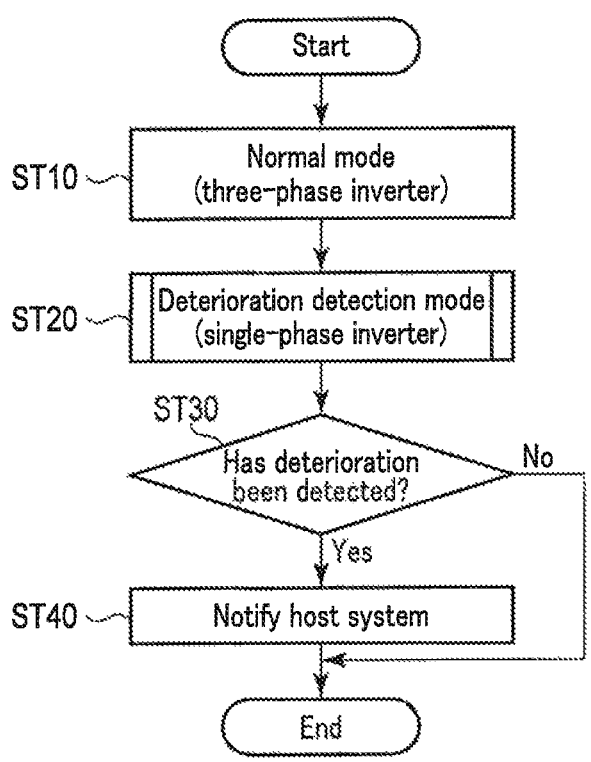
F I G. 4

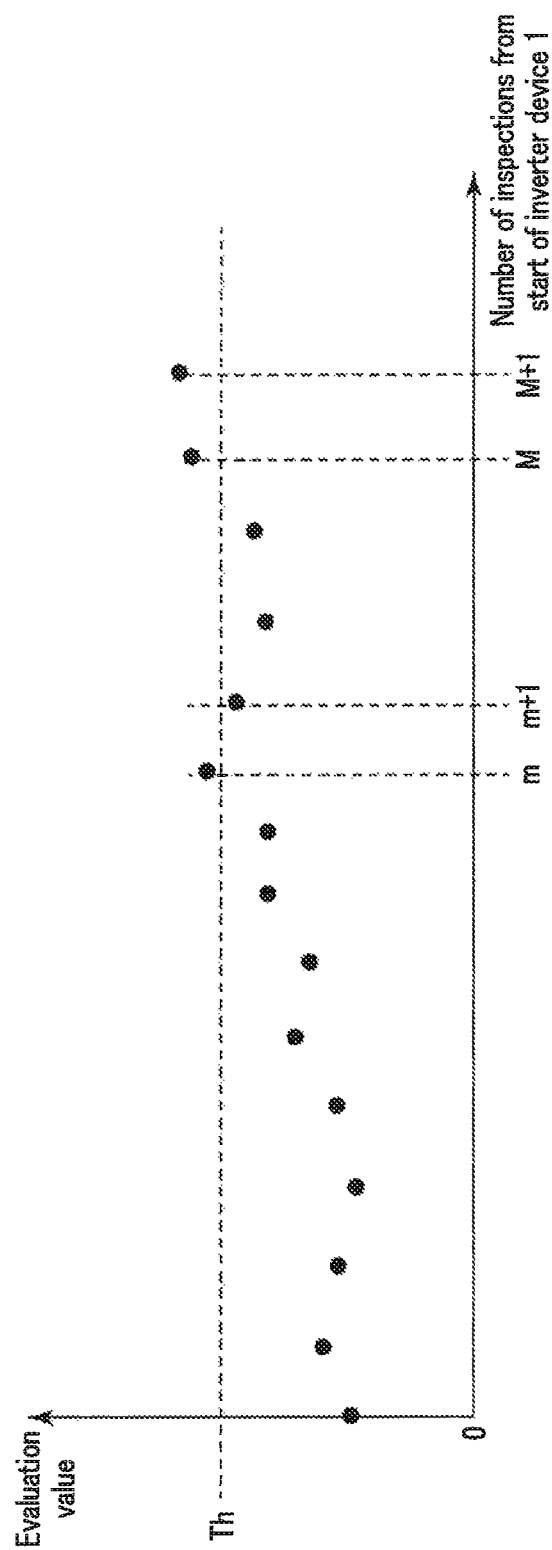
F I G. 10

| Inspection number | Target arm | Combination of arms forming single-phase inverter | Arm to which gate voltage V3 is applied |
|---|---|---|---|
| 1 | A1 | A1, A2, A3, A4 | A1 |
| 2 | A2 | | A2 |
| 3 | A3 | | A3 |
| 4 | A4 | | A4 |
| 5 | A5 | A3, A4, A5, A6 | A5 |
| 6 | A6 | | A6 |

FIG. 11

INVERTER DEVICE AND METHOD FOR DETECTING HEAT DISSIPATION CHARACTERISTICS OF INVERTER DEVICE

CROSS-REFERENCE TO RELATED APPLICATIONS

This application is based upon and claims the benefit of priority from prior Japanese Patent Application No. 2017-241938, filed Dec. 18, 2017, the entire contents of which are incorporated herein by reference.

FIELD

Embodiments described herein relate generally to an inverter device capable of detecting heat dissipation characteristics of a switching element.

BACKGROUND

Inverter devices are capable of driving an alternating current motor with high efficiency by causing a current to flow through the motor at a desired frequency, and positioned as a core technique of energy saving techniques. The inverter devices are widely applied to driving of alternating current motors used for industrial apparatuses such as trains, and various apparatuses requiring a large current, such as power conditioners of solar power generation and MRI (Magnetic Resonance Imaging) apparatuses.

When a large current flows through an inverter device, a switching element provided inside thereof is stressed by thermal stress caused by generated heat, and deteriorates in heat dissipation characteristics. A switching element with deteriorated heat dissipation characteristics can operate in a region falling out of a safe operation region by further heat generation, and may cause malfunction of the inverter device. To prevent such malfunction of the inverter device, various techniques have been presented to detect deterioration of heat dissipation characteristics of the switching element.

For example, a known method is a method of monitoring increase in temperature of the switching element with a temperature sensor attached thereto, and detecting deterioration in heat dissipation characteristics.

As another example, another known method is a method of estimating power loss of the switching element on the basis of information of the temperature and the current detected with a temperature sensor and a current sensor, and detecting deterioration in heat dissipation characteristics.

Because the heat dissipation characteristics of the switching element deteriorate little by little for a long time, it is unnecessary to always monitor the heat dissipation characteristics. Attaching a new sensor to each of switching elements to acquire information that does not require continuous monitoring is not efficient also from the viewpoint of design. For this reason, it is desirable to enable detection of the heat dissipation characteristics of the switching element without using a new sensor for the inverter device.

BRIEF DESCRIPTION OF THE DRAWINGS

FIG. 1 is a block diagram to explain an example of a configuration of an inverter device according to a first embodiment;

FIG. 3 is a diagram to explain characteristics of a transistor provided on the power element of the inverter device according to the first embodiment;

FIG. 4 is a flowchart to explain a whole operation in the inverter device according to the first embodiment;

FIG. 10 is a diagram to explain an operation of determining deterioration in heat dissipation characteristics in the deterioration detection mode in the inverter device according to the first embodiment;

FIG. 11 is a table to explain settings of an inspection sequence for respective target arms in the inverter device according to the first embodiment;

DETAILED DESCRIPTION

Figure 2:
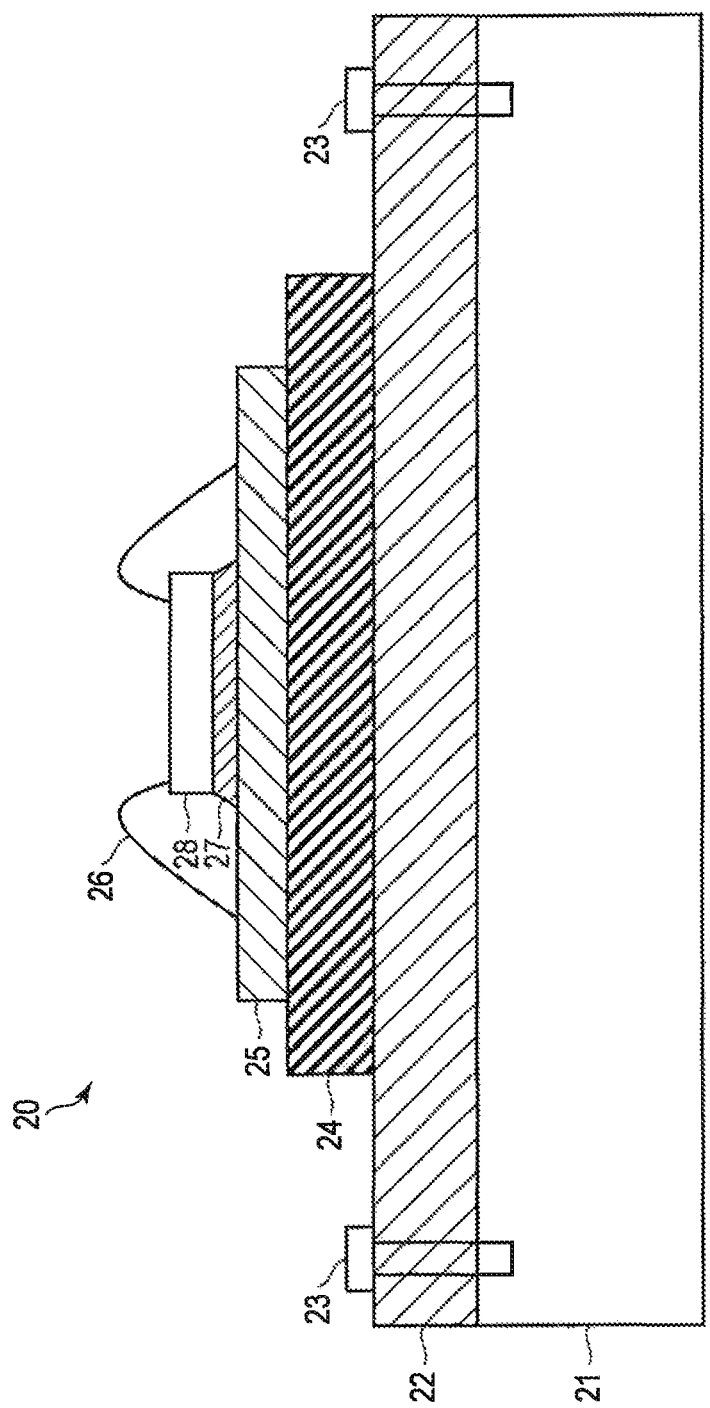
FIG. 2 is a cross sectional view to explain an example of a configuration of a power element of the inverter device according to the first embodiment.

In general, according to one embodiment, an inverter device includes: a first switching element electrically connected between a first node and a second node; a second switching element electrically connected between a third node and the second node; a third switching element electrically connected between the first node and a fourth node; a fourth switching element electrically connected between the third node and the fourth node; a current feedback controller configured to output a control command signal to control on or off timing of the first to the fourth switching elements, on the basis of a current signal indicating a current flowing through the second node or the fourth node; a pulse width modulator configured to be capable of switching an on or off state of each of the first to the fourth switching elements, on the basis of the control command signal; and a detection unit configured to detect heat dissipation characteristics of each of the first to the fourth switching elements, on the basis of the control command signal, wherein when the detection unit detects the heat dissipation characteristics of each of the first to the fourth switching elements, the pulse width modulator sets a voltage value at a time when one of the first to the fourth switching elements is set to the on state to a first voltage, and sets a voltage value at a time when the other three of the first to the fourth switching elements are set to the on state to a second voltage larger than the first voltage.

Hereinafter, embodiments will be described with reference to the drawings. In the following description, common reference numerals denote components having the same functions and configurations.

First Embodiment

An inverter device according to a first embodiment will be described.

The inverter device according to the first embodiment is widely applicable to a driving device of an alternating current motor used for, for example, a train, an elevator, or an industrial robot, a power conditioner used for solar power generation equipment, or an MRI apparatus. The inverter device is capable of detecting deterioration in heat dissipation characteristics of, for example, a switching element provided inside thereof.

First, a configuration of the inverter device according to the first embodiment will be described.

FIG. 1 is a block diagram showing an example of a configuration of the inverter device 1 according to the first embodiment. As shown in FIG. 1, the inverter device 1 includes a power supply 10, a power element module 20, a motor coil 30, an A/D (Analog to Digital) converter 40, a current feedback controller 50, a pulse width modulator (PWM) 60, and a deterioration detection unit 70. The inverter device 1 has a structure of three-phase inverter, and has a function of generating an alternating current at a desired frequency from a direct current, and supplying the alternating current to a load (not illustrated) in the motor coil 30.

The power supply 10 supplies a voltage to input a direct current to the power element module 20. The power supply 10 is, for example, connected with a node N1 and a node N2, and generates a predetermined difference in potential in the node N2 with respect to the grounded node N1.

The power element module 20 converts the direct current input from the power supply 10 into an alternating current at a desired frequency, and outputs the alternating current to the motor coil 30. The power element module 20 includes, for example, six arms A1, A2, A3, A4, A5, and A6. Each of the arms A1 to A6 includes, for example, at least one power element. The example of FIG. 1 shows the case where each of the arms A1 to A6 includes one power element, as an example.

Each of the power elements includes, for example, one transistor and one diode. The transistor functions as a switching element to generate an alternating current to be supplied to the motor coil 30. For example, a metal-oxide-semiconductor field-effect transistor (MOSFET) is applied as the transistor. As another example, an applicable transistor is a transistor having, for example, an n type polarity and using silicon carbide (SiC) for the channel region. The diode functions as, for example, a freewheeling diode to let a current pass in a direction opposite to the voltage applied with the power supply 10.

Specifically, the arm A1 includes a transistor Tr1 and a diode D1. The transistor Tr1 includes, for example, a drain end connected with the node N2, a source end and a back gate connected with a node U, and a gate to which a pulse width modulation signal P1 is input from the pulse width modulator 60. The diode D1 includes an input end connected with the node U, and an output end connected with the node N2.

The arm A2 includes a transistor Tr2 and a diode D2. The transistor Tr2 includes, for example, a drain end connected with the node U, a source end and a back gate connected with the node N1, and a gate to which a pulse width modulation signal P2 is input from the pulse width modulator 60. The diode D2 includes an input end connected with the node N1, and an output end connected with the node U.

The arm A3 includes a transistor Tr3 and a diode D3. The transistor Tr3 includes, for example, a drain end connected with the node N2, a source end and a back gate connected with a node V, and a gate to which a pulse width modulation signal P3 is input from the pulse width modulator 60. The diode D3 includes an input end connected with the node V, and an output end connected with the node N2.

The arm A4 includes a transistor Tr4 and a diode D4. The transistor Tr4 includes, for example, a drain end connected with the node V, a source end and a back gate connected with the node N1, and a gate to which a pulse width modulation signal P4 is input from the pulse width modulator 60. The diode D4 includes an input end connected with the node N1, and an output end connected with the node V.

The arm A5 includes a transistor Tr5 and a diode D5. The transistor Tr5 includes, for example, a drain end connected with the node N2, a source end and a back gate connected with a node W, and a gate to which a pulse width modulation signal P5 is input from the pulse width modulator 60. The diode D5 includes an input end connected with the node W, and an output end connected with the node N2.

The arm A6 includes a transistor Tr6 and a diode D6. The transistor Tr6 includes, for example, a drain end connected with the node W, a source end and a back gate connected with the node N1, and a gate to which a pulse width modulation signal P6 is input from the pulse width modulator 60. The diode D6 includes an input end connected with the node N1, and an output end connected with the node W.

The motor coil 30 includes three input ends connected with the three nodes U, V, and W, respectively. The motor coil 30 generates, for example, a rotative force in accordance with the alternating current output from the power element module 20 via the nodes U, V, and W, and transmits the rotative force to the inside load.

With the configuration described above, the circuit formed of the power supply 10, the power element module 20, and the motor coil 30 is capable of selecting one of six current paths, in accordance with the way of selection of the arms A1 to A6. The six current paths can be switched at desired timing by, for example, switching the on/off states of the transistors Tr (Tr1 to Tr6).

Note that the six current paths are, specifically, a path (path a) passing through the arms A1 and A4, a path (path b) passing through the arms A2 and A3, a path (path c) passing through the arms A3 and A6, a path (path d) passing through the arms A4 and A5, a path (path e) passing through the arms A5 and A2, and a path (path f) passing through the arms A6 and A1. The path a and the path b supply currents flowing in directions opposite to each other to the motor coil 30 through the nodes U and V. The path c and the path d supply currents flowing in directions opposite to each other to the motor coil 30 through the nodes V and W. The path e and the path f supply currents flowing in directions opposite to each other to the motor coil 30 through the nodes W and U. That is, the motor coil 30 is capable of supplying currents flowing through the path a and the path b, currents flowing through the path c and the path d, and currents flowing through the path e and the path f, as mutually different three alternating currents, to the inside load.

In the following description, for convenience, the directions of the currents flowing through the paths a, path c, and path e are the positive direction.

The A/D converter 40 receives, for example, input of the current flowing through any two (nodes U and V in FIG. 1) of the nodes U, V, and W. The A/D converter 40 evaluates the magnitude of the current supplied to the motor coil 30, to generate a current signal corresponding to the magnitude of the current. Specifically, the current signal is a signal indicating the magnitude of the alternating current actually supplied to the motor coil 30. The current signal is used for generating a signal input to the current feedback controller 50.

The current feedback controller 50 receives a difference signal between a current command signal designating the magnitude of the alternating current to be supplied to the motor coil 30 and the current signal. The current feedback controller 50 performs vector control in accordance with the magnitude of the difference signal, and generates a control command signal commanding control of the operation of the power element module 20. Specifically, for example, when the value of the alternating current indicated with the current signal is small with respect to the value of the alternating current indicated with the current command signal, the current feedback controller 50 generates a control command signal serving as an instruction to increase the value of the alternating current generated with the power element module 20. In addition, for example, when the value of the alternating current indicated with the current signal is large with respect to the value of the alternating current indicated with the current command signal, the current feedback controller 50 generates a control command signal serving as an instruction to decrease the value of the alternating current generated with the power element module 20. The control command signal generated as described above is output to the pulse width modulator 60 and the deterioration detection unit 70.

The pulse width modulator 60 includes six output ends connected with the respective arms A1 to A6, respectively. When the pulse width modulator 60 receives a control command signal from the current feedback controller 50, the pulse width modulator 60 generates six different pulse width modulation signals P1 to P6 in accordance with the control command signal, and outputs the signals to the arms A1 to A6 through the six output ends, respectively. The pulse width modulation signal has two logic levels enabling switching of the on/off state of the transistor Tr. Specifically, when the pulse width modulation signal has a logical level "H", the pulse width modulation signal changes the transistor Tr to the on state. When the pulse width modulation signal has a logical level "L", the pulse width modulation signal changes the transistor Tr to the off state. It should be noted that the pulse width modulator 60 is capable of generating at least two types of signals such that the pulse width modulation signals P1 to P6 have different voltage values at the level "H". With this configuration, the pulse width modulator 60 is capable of controlling flowability (for example, the on-resistance) of the current of the transistor Tr for each of the transistors. The pulse width modulation signals P1 to P6 output with the pulse width modulator 60 will be described later.

With the configuration described above, the inverter device 1 forms a current feedback control system enabling control of the current actually supplied to the motor coil 30 such that the current is controlled to be close to the current to be supplied to the motor coil 30. That is, the current feedback controller 50 causes the result of feedback to reflect on the control command signal, to control the timing of on/off switching of the arms A1 to A6 through the pulse width modulator 60.

When the deterioration detection unit 70 receives a control command signal from the current feedback controller 50, the deterioration detection unit 70 detects deterioration of the arms A1 to A6 in the power element module 20, on the basis of the control command signal. Specifically, the deterioration detection unit 70 can determine whether the heat dissipation characteristics of the transistor Tr deteriorate or not.

Specifically, the deterioration detection unit 70 stores the received control command signal in a memory (not shown) for a predetermined period, and extracts envelopes of the control command signal. The deterioration detection unit 70 calculates an evaluation value on the basis of the value of the extracted envelopes at a predetermined point in time, and determines whether the evaluation value is larger than a predetermined threshold or not. The deterioration detection unit 70 detects deterioration in heat dissipation characteristics of the transistor Tr, on the basis of the result of determination. The details of the operation performed with the deterioration detection unit 70 will be described later.

Next, the configuration of the power element of the inverter device according to the first embodiment will be described.

FIG. 2 is a cross sectional view to explain the configuration of the power element of the inverter device according to the first embodiment. The example of FIG. 2 shows a cross sectional view to explain a stacked structure of one power element 28 in the power element module 20.

As shown in FIG. 2, the power element 28 is provided above a heat sink 21. This structure forms a heat dissipation path through which heat is released to the outside via the heat sink 21 when the power element 28 generates heat by drive of the inverter device 1.

More specifically, a base plate 22 is provided on an upper surface of the heat sink 21. The base plate 22 is a substrate to stack an insulating layer 24, a circuit layer 25, a solder 27, and the power element 28 thereon as one unitary piece, and includes, for example, aluminum (Al). The base plate 22 is, for example, screwed to the heat sink 21 with screws 23 to couple the power element 28 with the heat sink 21.

The insulating layer 24 is provided on an upper surface of the base plate 22. The insulating layer 24 includes, for example, epoxy resin.

The circuit layer 25 is provided on the insulating layer 24. The circuit layer 25 is bonded to the power element 28 via wire 26, and functions as a circuit supplying various voltages and other signals to the power element 28. For example, a circuit pattern with copper (Cu) is formed on the circuit layer 25.

The solder 27 is provided on an upper surface of the circuit layer 25. The power element 28 is provided on an upper surface of the solder 27 to couple the circuit layer 25 with the power element 28.

With the configuration described above, heat generated with the power element 28 is conducted to the heat sink 21 through the solder 27, the circuit layer 25, the insulating layer 24, and the base plate 22, and dissipated to the outside.

However, when the thermal conductivity in the heat dissipation path deteriorates (decreases) for any cause, the heat dissipation quantity becomes small with respect to the heat generation quantity of the power element 28, and the heat dissipation characteristics may deteriorate. One of causes of deterioration in heat dissipation characteristics of the power element 28 is cracks occurring in the solder 27. The solder 27 is stressed with thermal stress, with cycles of heat generation and heat dissipation of the power element 28. For this reason, a crack occurring in the solder 27 may gradually grow with lapse of time. Accordingly, a crack occurring in the solder 27 may gradually deteriorate the heat dissipation characteristics of the power element 28, and cause any failure in the operation of the inverter device 1.

Next, characteristics of the transistors used for the inverter device according to the first embodiment will be described.

FIG. 3 is a diagram to explain characteristics of the transistor provided in the power element of the inverter device according to the first embodiment. FIG. 3 shows characteristics of the transistor Tr provided in the power element 28. In FIG. 3, the horizontal axis indicates the source-drain voltage $V_{DS}$, and the vertical axis indicates the drain current $I_D$. In FIG. 3, characteristics of the transistor Tr are indicated in accordance with the magnitude of applied gate voltages V1, V2, and V3. In the example of FIG. 3, the gate voltage V1 is larger than the gate voltage V2, and the gate voltage V3 is smaller than the gate voltage V2 (V1>V2>V3). FIG. 3 also shows temperature characteristics of the transistors Tr. Specifically, in FIG. 3, solid lines show characteristics of the transistor Tr in the case where the transistor Tr operates at temperature T1 (for example, normal temperature (such as 25° C.)), and broken lines show characteristics of the transistor Tr in the case where the transistor Tr operates at temperature T2 (>T1) (for example, high temperature (such as 100° C.)).

As shown in FIG. 3, in normal operation, the on-resistance of the transistor Tr decreases as the gate voltage increases. That is, the magnitude of the drain current $I_D$ flowing with respect to the source-drain voltage $V_{DS}$ of the same magnitude is larger in the transistor Tr to which the gate voltage V1 is applied than the transistor Tr to which the gate voltage V3 is applied.

In addition, when the temperature increases from T1 to T2, characteristics of the transistor Tr change in different ways, for example, with a boundary around the case where the gate voltage V2 is applied. Specifically, when the gate voltage V2 is applied, the on-resistance of the transistor Tr hardly changes even when the temperature increases. By contrast, when the gate voltage V1 is applied, the on-resistance of the transistor Tr increases when the temperature increases. By contrast, when the gate voltage V3 is applied, the on-resistance of the transistor Tr decreases when the temperature increases.

When the heat dissipation characteristics of the power element 28 deteriorate due to a crack occurring in the solder 27, the temperature increase quantity of the transistor Tr increases. For this reason, when the transistor Tr in the power element 28 with deteriorated heat dissipation characteristics has a larger on-resistance increase quantity than the transistor Tr in the power element 28 with normal heat dissipation characteristics when the gate voltage V1 is applied, and has a larger on-resistance decrease quantity when the gate voltage V3 is applied.

Next, operations of the inverter device according to the first embodiment will be described.

First, the whole operation of the inverter device according to the first embodiment will be described.

FIG. 4 is a flowchart to explain the whole operation of the inverter device according to the first embodiment. As shown in FIG. 4, the inverter device 1 is capable of operating in two modes, that is, a normal mode and a deterioration detection mode, for example, in accordance with an instruction from the host system (not shown).

At Step ST10, the inverter device 1 operates in the normal mode. The normal mode is a state in which the whole system (such as a train, an elevator, an escalator, and an industrial robot) including the inverter device 1 operates to achieve its object, and a mode to operate the inverter device 1 as a three-phase inverter. For example, when the whole system including the inverter device 1 is a train, the normal mode is applied in commercial operation in which the train operates with passengers thereon. In operation in the normal mode, because the magnitude of the load in the motor coil 30 continuously changes, the magnitude of the current flowing through the motor coil 30 may continuously change.

At Step ST20, the inverter device 1 operates in the deterioration detection mode. The deterioration detection mode is a state applied in the time period different from that of the normal mode, and a mode to operate the inverter device 1 as a single phase inverter. For example, when the whole system including the inverter device 1 is a train, the deterioration detection mode is applied in the time period before and after the commercial operation described above, night during which the commercial operation is stopped, or a periodic inspection. In the deterioration detection mode, the load in the motor coil 30 is fixed, and the current feedback controller 50 generates a control command signal such that an alternating current of a predetermined magnitude and a predetermined frequency flows through the motor coil 30 in accordance with a predetermined inspection sequence. Specifically, for example, in the deterioration detection mode, control is performed such that the alternating current flowing through the motor coil 30 serves as a sine wave with amplitude of several amperes and approximately 10 Hz. The details of the deterioration detection mode will be described later.

At Step ST30, the deterioration detection unit 70 determines whether the heat dissipation characteristics deteriorates or not, for each of the arms A1 to A6 in the power element module 20, on the basis of the result of the inspection sequence executed in the deterioration detection mode. As a result of determination, when no deterioration in heat dissipation characteristics is detected in each of the arms A1 to A6 (No at Step ST30), the process ends. When deterioration in heat dissipation characteristics is detected in any one of the arms A1 to A6 (Yes at Step ST30), the process proceeds to Step ST40.

At Step ST40, the deterioration detection unit 70 notifies the host system of information indicating the arm in which deterioration in heat dissipation characteristics has been detected.

With the operation described above, the inverter device 1 is enabled to detect deterioration in heat dissipation characteristics in the arms A1 to A6 in a time period during which no normal operation is performed. Accordingly, occurrence of malfunction in normal operation is prevented.

Then, operations in the deterioration detection mode including an operation of detecting deterioration in heat dissipation characteristics, in the whole operation in the inverter device according to the first embodiment described above, will be described. Because the normal mode includes no operation of detecting deterioration in heat dissipation characteristics, an explanation thereof is omitted.

Figure 5:
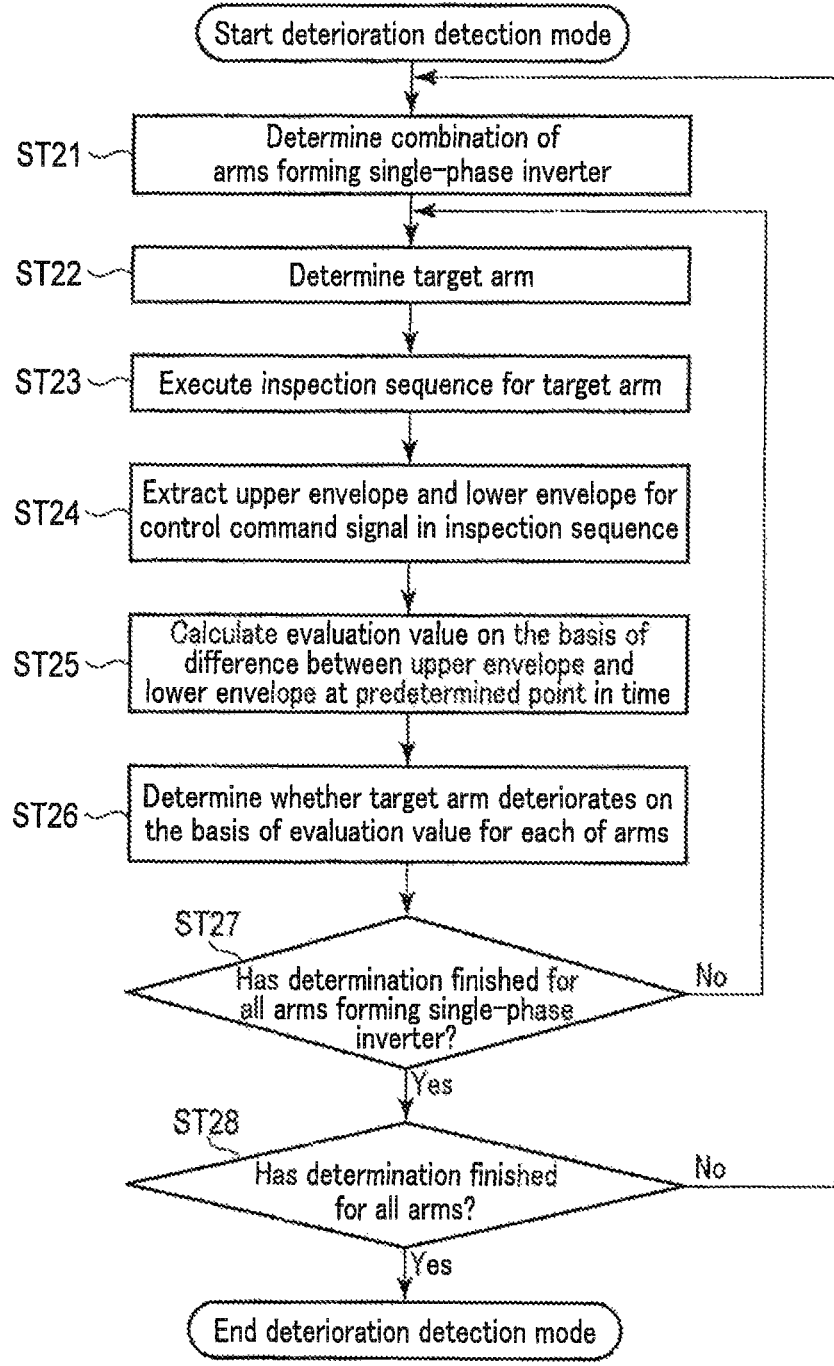
FIG. 5 is a flowchart to explain operations of a deterioration detection mode in the inverter device according to the first embodiment.

A flowchart of the deterioration detection mode in the inverter device according to the first embodiment will be described with reference to FIG. 5. FIG. 5 shows details of Step ST20 shown in FIG. 4.

As shown in FIG. 5, at Step ST21, the pulse width modulator 60 determines a combination of arms used in the single-phase inverter formed in the deterioration detection mode.

At Step ST22, the pulse width modulator 60 determines an arm for which it is determined whether the heat dissipation characteristics of the power element 28 deteriorate or not, among the combination of the arms determined at Step ST21. In the following explanation, the arm for which it is determined whether the heat dissipation characteristics of the power element 28 deteriorate or not is referred to as "arm serving as detection target of deterioration in heat dissipation characteristics" (also simply referred to as "target arm").

At Step ST23, the inverter device 1 executes an inspection sequence to determine whether the target arm determined at Step ST22 deteriorates in heat dissipation characteristics or not. The details of the inspection sequence will be described later. The deterioration detection unit 70 stores a control command signal generated in the inspection sequence in, for example, a memory (not illustrated).

At Step ST24, the deterioration detection unit 70 extracts envelopes for the control command signal generated at Step ST23. The deterioration detection unit 70 extracts an upper envelope enveloping points at which the amplitude of the control command signal becomes maximum, and a lower envelope enveloping points at which the amplitude becomes minimum.

At Step ST25, the deterioration detection unit 70 calculates an evaluation value used for determining whether the target arm deteriorates in heat dissipation characteristics or not, on the basis of the envelopes extracted at Step ST24. Specifically, the deterioration detection unit 70 calculates an evaluation value, on the basis of a difference between the upper envelope and the lower envelope at the time after a predetermined time has passed from the point in time of start of the inspection sequence.

At Step ST26, the deterioration detection unit 70 determines whether deterioration in heat dissipation characteristics of the target arm exists or not, on the basis of the evaluation value calculated at Step ST25.

Specifically, the deterioration detection unit 70 determines whether deterioration in heat dissipation characteristics of the target arm exists or not, on the basis of whether the evaluation value exceeds a predetermined threshold or not.

At Step ST27, the inverter device 1 determines whether determination as to presence of deterioration in heat dissipation characteristics has finished or not for all the arms forming the single-phase inverter. When determination as to presence of deterioration in heat dissipation characteristics has not finished for at least one of all the arms forming the single-phase inverter (No at Step ST27), the process returns to Step ST22, and the inverter device 1 determines the arm, for which determination as to presence of deterioration in heat dissipation characteristics has not finished, as the target arm, and executes Steps ST23 to ST26 again. When determination as to presence of deterioration in heat dissipation characteristics has finished for all the arms forming the single-phase inverter (Yes at Step ST27), the process proceeds to Step ST28.

At Step ST28, the inverter device 1 determines whether determination as to presence of deterioration in heat dissipation characteristics has finished for all the arms or not. When determination as to presence of deterioration in heat dissipation characteristics has not finished for all the arms (No at Step ST28), the process returns to Step ST21, and the inverter device 1 determines a combination of the arms to form a single-phase inverter and including the arm for which determination as to presence of deterioration in heat dissipation characteristics has not finished, and executes Step ST22 to ST26 again. When determination as to presence of deterioration in heat dissipation characteristics has finished for all the arms (Yes at Step ST28), the inverter device 1 ends the deterioration detection mode.

Next, the inspection sequence of the deterioration detection mode in the inverter device according to the first embodiment will be described.

Figure 6:
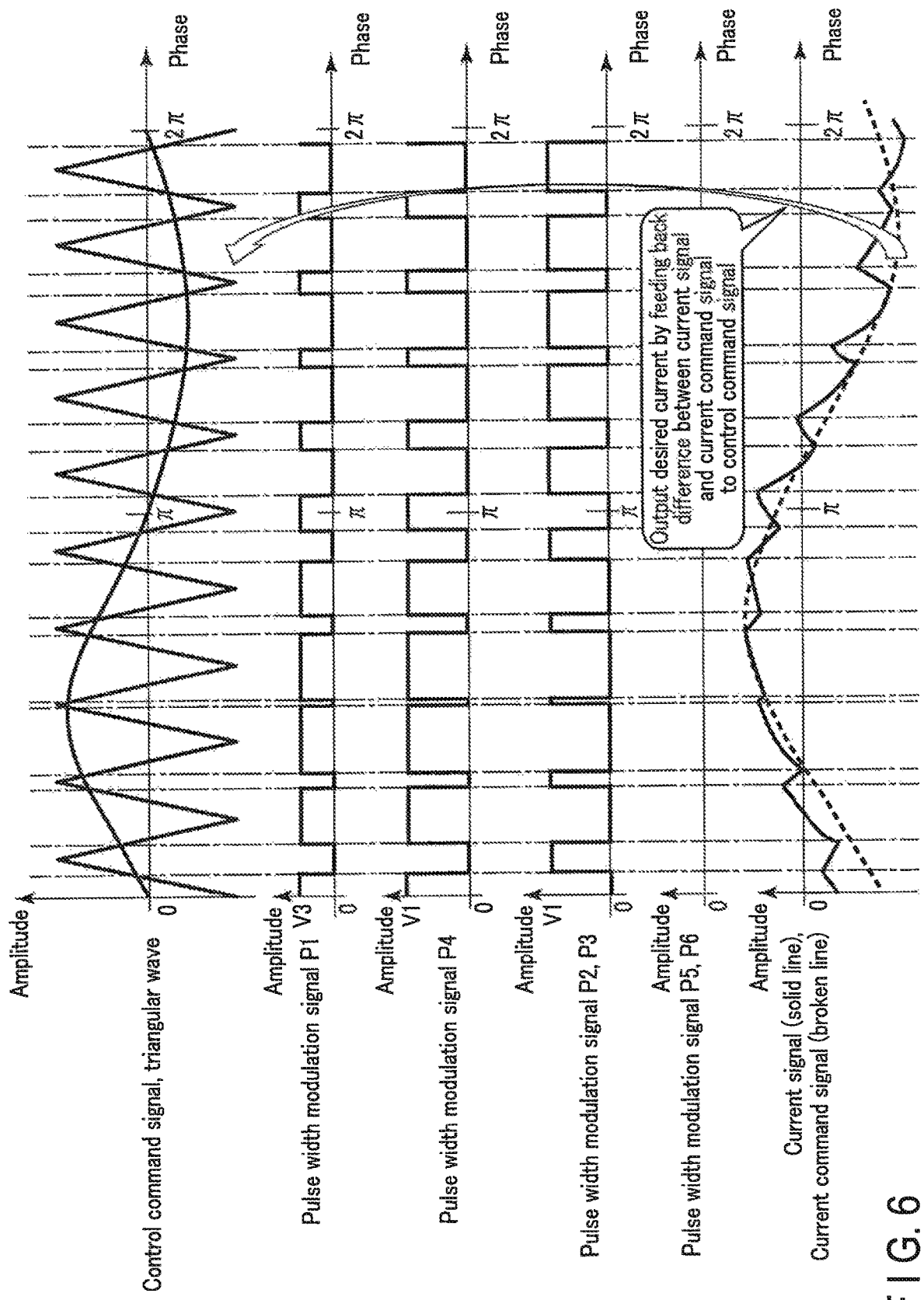
FIG. 6 is a timing chart to explain operations of the deterioration detection mode in the inverter device according to the first embodiment.

FIG. 6 is a timing chart to explain the inspection sequence of the deterioration detection mode in the inverter device according to the first embodiment. FIG. 6 corresponds to Step ST23 explained in FIG. 5.

Specifically, FIG. 6 shows various signals input and output to and from the current feedback controller 50 and the pulse width modulator 60 in inspection sequence, with the horizontal axis serving as the phase and the vertical axis serving as the amplitude.

The example of FIG. 6 shows part (for one wavelength) of the inspection sequence in the case where the single-phase inverter is formed of the arms A1 to A4 in the arms A1 to A6 at Step ST21 explained in FIG. 5. The example of FIG. 6 also shows part of the inspection sequence in the case where the arm A1 is determined as the target arm among the arms A1 to A4 forming the single-phase inverter at Step ST22 explained in FIG. 5.

As shown in FIG. 6, the pulse width modulator 60 receives a control command signal from the current feedback controller 50, and a triangular wave serving as a reference signal to generate pulse width modulation signals P1 to P6 based on the control command signal. The triangular wave includes, for example, a frequency and an amplitude higher than those of the control command signal, and classified into two time periods, that is, a time period in which the triangular wave has an amplitude value larger than that of the control command signal, and a time period in which the triangular wave has an amplitude value smaller than that of the control command signal.

The pulse width modulator 60 compares the triangular wave with the control command signal. When the amplitude of the triangular wave is larger than the amplitude of the control command signal, the pulse width modulator 60 sets the pulse width modulation signals P1 and P4 to level "L", and sets pulse width modulation signals P2 and P3 to level "H". By contrast, when the amplitude of the triangular wave is smaller than the amplitude of the control command signal as a result of comparing the triangular wave with the control command signal, the pulse width modulator 60 sets the pulse width modulation signals P2 and P3 to level "L", and sets pulse width modulation signals P1 and P4 to level "H". It should be noted that, in the inspection sequence, the pulse width modulator 60 maintains the pulse width modulation signals P5 and P6 at level "L".

By the operation as described above, the pair of arms A1 and A4 and the pair of arms A2 and A3 are periodically switched between the on state and the off state. In this manner, the amplitude of the current flowing through the node U increases and decreases such that the current flows in the positive direction when the pulse width modulation signals P1 and P4 are set to level "H" and flows in the negative direction when the pulse width modulation signals P2 and P3 are set to level "H".

In this operation, the pulse width modulator 60 applies the gate voltage V3 as the pulse width modulation signal P1 of level "H" to the transistor Tr1 of the arm A1 serving as the target arm. By contrast, the pulse width modulator 60 applies the gate voltage V1 as the pulse width modulation signals P2 to P4 of level "H" to the transistors Tr2 to Tr4 of the arms A2 to A4 that do not serve as the target arm. In this manner, the transistor Tr1 has an on-resistance larger than those of the other transistors Tr2 to Tr4. For this reason, when the amplitude of the control command signal has a vertically symmetrical shape, the current flowing through the arms A1 and A4 becomes smaller than the current flowing through the arms A2 and A3.

Therefore, to cause the current signal to follow the current command signal, the current feedback controller 50 generates a control command signal such that the amplitude of the control command signal at the time when the current flows through the arms A1 and A4 becomes larger than the amplitude at the time when the current flows through the arms A2 and A3. This operation enables the current signal to follow the current command signal, in consideration of the influence of the on-resistance of the transistor Tr1 larger than the on-resistances of the other transistors Tr2 and Tr4.

It should be noted that, in the inspection sequence, the characteristics of the circuit formed of the power supply 10, the power element module 20, and the motor coil 30 may change. With such a change, a difference may occur between the current command signal and the current signal. In this case, the current feedback controller 50 further corrects the control command signal, in accordance with the value of the difference between the current signal and the current command signal. More specifically, the current feedback controller 50 increases the amplitude of the control command signal, when the current feedback controller 50 determines that the amplitude of the current signal is smaller than the current command signal. In addition, the current feedback controller 50 decreases the amplitude of the control command signal, when the current feedback controller 50 determines that the amplitude of the current signal is larger than the current command signal. In this manner, the current feedback controller 50 is enabled to provide the control command signal with feedback such that the difference between the current command signal and the current signal decreases. Accordingly, the pulse width modulator 60 is enabled to generate pulse width modulation signals P1 to P4 in accordance with the corrected control command signal.

One of main causes of occurrence of change in characteristics in the circuit as described above is, for example, change in on-resistance of the transistor Tr with increase in temperature of the power element module 20.

Figure 7:
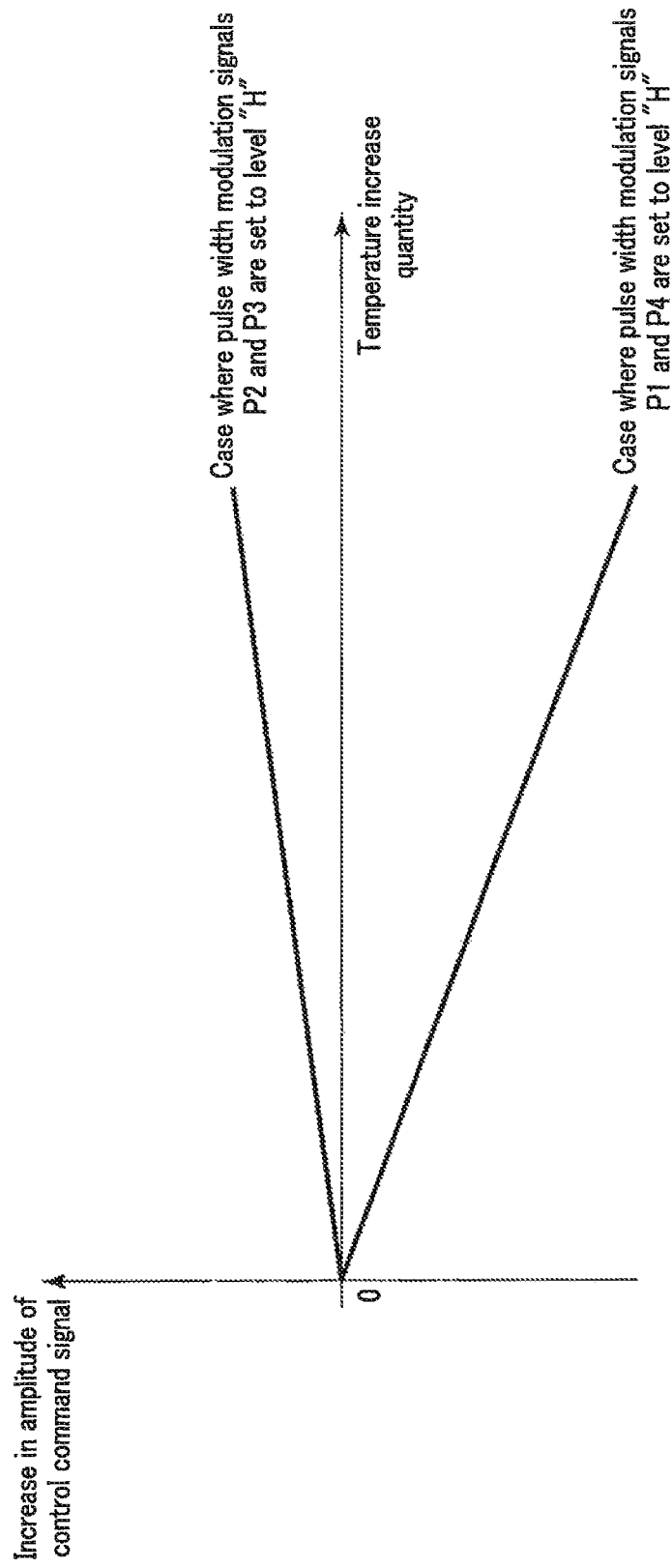
FIG. 7 is a diagram to explain relation between temperature increase quantity of the power element module and an increase in amplitude of a control command signal in the inverter device according to the first embodiment.

FIG. 7 is a diagram to explain relation between temperature increase quantity of the power element module and an increase in amplitude of the control command signal in the inverter device according to the first embodiment.

FIG. 7 shows an increase in amplitude of the control command signal with respect to the temperature increase quantity, in the inspection sequence explained in FIG. 6, with the start time of the inspection sequence serving as the start point. As shown in FIG. 7, an increase in amplitude of the control command signal differs according to the direction of the current.

First, the case where the pulse width modulation signals P2 and P3 are set to level "H" (the case where the current flows through the arm A3, the motor coil 30, and the arm A2 in this order) will be described.

As described above, the on-resistances of the transistors Tr2 and Tr3 to which the gate voltage V1 is applied increase with increase in temperature. When the on-resistances of the transistors Tr2 and Tr3 increase, the current feedback controller 50 increases the amplitude of the control command signal to suppress decrease in current signal. Accordingly, as shown in FIG. 7, when the pulse width modulation signals P2 and P3 are set to level "H", the amplitude of the control command signal increases with increase in temperature.

Then, the case where the pulse width modulation signals P1 and P4 are set to level "H" (the case where the current flows through the arm A1, the motor coil 30, and the arm A4 in this order) will be described.

As described above, because the gate voltage V1 is applied to the transistor Tr4, the on-resistance increases with increase in temperature. However, the on-resistance of the transistor Tr1 to which the gate voltage V3 is applied increases with increase in temperature. In addition, as shown in FIG. 3, in the case where the drain current $I_D$ of the same magnitude flows, the change quantity of the on-resistance with increase in temperature is larger in the case where the gate voltage V3 is applied than that in the case where the gate voltage V1 is applied. For this reason, when the pulse width modulation signals P1 and P4 are set to level "H", the on-resistance of the whole circuit decreases with increase in temperature. In addition, the decrease quantity of the on-resistance is larger than that in the case where the pulse width modulation signals P2 and P3 are set to level "H". Accordingly, as shown in FIG. 7, when the pulse width modulation signals P1 and P4 are set to level "H", the amplitude of the control command signal decreases with increase in temperature, and the absolute value of the change quantity is larger than that in the case where the pulse width modulation signals P2 and P3 are set to level "H".

Next, the operation of extracting envelopes of the control command signal in the deterioration detection mode in the inverter device according to the first embodiment will be described, with reference to FIG. 8.

Figure 8:
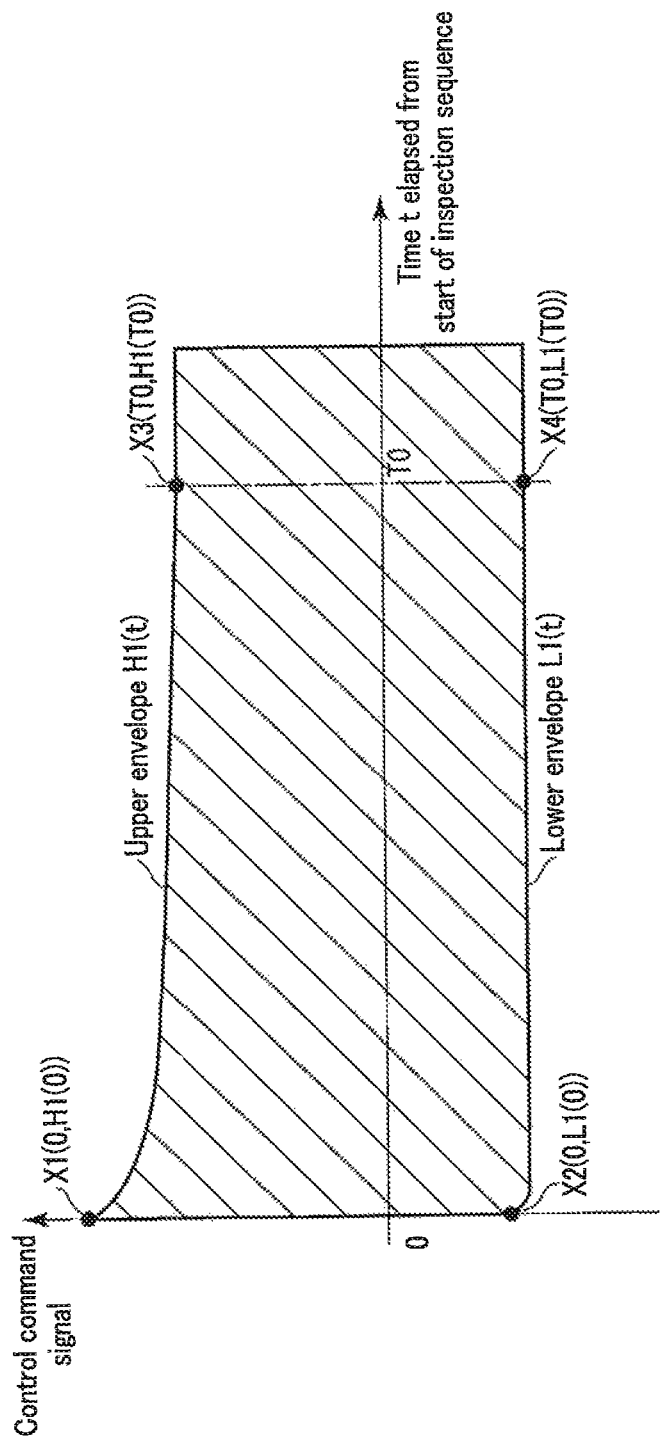
FIG. 8 is a schematic diagram to explain an envelope extraction operation of the deterioration detection mode in the inverter device according to the first embodiment.

FIG. 8 corresponds to Step ST24 explained in FIG. 5. FIG. 8 schematically shows the state in which the envelopes of the control command signal is extracted, with the horizontal axis indicating the time t elapsed from start of inspection sequence, and the vertical axis indicating the control command signal. In the example of FIG. 8, because the scale of the elapsed time t serving as the horizontal axis is long with respect to one period of the control command signal, the detailed fluctuations of the control command signal is omitted, and the amplitude is hatched with the extreme values serving as borderlines. Specifically, the maximum value of the amplitude of the control command signal is illustrated as an upper envelope H1 (t), and the minimum value is illustrated as a lower envelope L1 (t).

As shown in FIG. 8, the upper envelope H1 (t) of the control command signal transitions in a direction in which the amplitude decreases from the point X1 (0, H1 (0)) at the point in time (t=0) when the inspection sequence is started, and reaches the point X3 (T0, H1 (T0)) at the time (t=T0) after a predetermined period has passed. The lower envelope L1 (t) transitions in a direction in which the amplitude increases from the point X2 (0, L1 (0)) at the point in time (t=0) when the inspection sequence is started, and reaches the point X4 (T0, L1 (T0)) at the time (t=T0) after a predetermined period has passed.

With flow of the current therethrough, the temperatures of the transistors Tr1 to Tr4 increase, and the on-resistances thereof change. As described in FIG. 7, even when all the temperature change quantities of the transistors Tr1 to Tr4 are substantially equal, the change quantity of the upper envelope H1 (t) is larger than the change quantity of the lower envelope L1 (t). In addition, because the on-resistance of the transistor Tr1 is larger than those of the other transistors Tr2 to Tr4, the transistor Tr1 has a larger heat generation quantity, and more easily increases in temperature. For this reason, the change quantity of the upper envelope H1 (t) becomes further larger than the change quantity of the lower envelope L1 (t).

Next, the evaluation value calculation operation and the operation of determining heat dissipation characteristics in the deterioration detection mode in the inverter device according to the first embodiment will be described.

Figure 9:
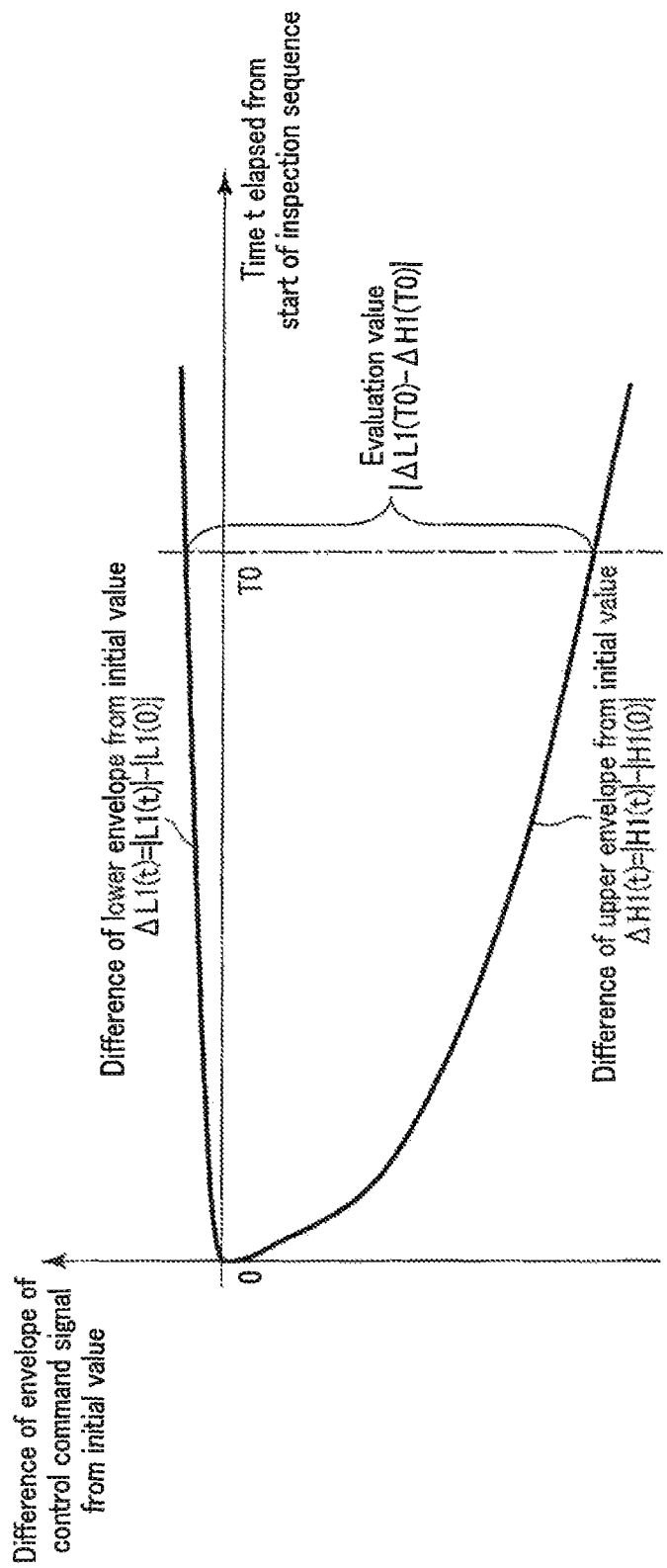
FIG. 9 is a diagram to explain an evaluation value calculation operation in the deterioration detection mode in the inverter device according to the first embodiment.

FIG. 9 is a diagram to explain the evaluation value calculation operation in the deterioration detection mode in the inverter device according to the first embodiment. FIG. 9 corresponds to Step ST25 explained in FIG. 5. FIG. 9 shows the calculated evaluation value, with the horizontal axis indicating the time t elapsed from start of inspection sequence, and the vertical axis indicating a difference of the envelope from the initial value.

Specifically, FIG. 9 shows a difference $\Delta L1$ $(t)=|L1(t)|-|L1(0)|$ of the lower envelope from the initial value, and a difference $\Delta H1$ $(t)=|H1(t)|-|H1(0)|$ of the upper envelope from the initial value.

As shown in FIG. 9, the deterioration detection unit 70 calculates the absolute value of a difference between a difference $\Delta L1$ (T0) of the lower envelope from the initial value and a difference $\Delta H1$ (T0) of the upper envelope from the initial value, as the evaluation value, after predetermined time T0 has passed. That is, the evaluation value is expressed as $|\Delta L1 (T0)-\Delta H1 (T0)|$.

Obtaining a difference between the upper envelope and the lower envelope enables cancellation of the cause of fluctuations of the control command signal other than change in on-resistance with increase in temperature of the transistors Tr1 to Tr4, such as load in the motor coil 30 and parasitic resistance of the wiring cable.

As described above, the inspection sequence is executed, for example, in periodic inspection. For this reason, the intervals at which the inspection sequence is executed may be separated from each other by days or months, and the evaluation value calculated for each inspection sequence may be influenced by fluctuations with lapse of time in the unit of days or months. Specifically, the evaluation value calculated for each inspection sequence may be influenced by change with lapse of time in the output of the current sensor that senses the current signal. For this reason, the evaluation value is obtained by determining a difference between the value of the envelope after a predetermined time has passed and the initial value. This operation enables cancellation of change with lapse of time appearing in the current signal itself, and enables accurate extraction of change quantity of the control command signal due to change in on-resistance with increase in temperature of the transistors Tr1 to Tr4.

Because the gate voltage applied to the transistor Tr1 serving as the target arm is lower than the voltage applied to the other transistors Tr2 to Tr4, the transistor Tr1 has a larger change quantity of the on-resistance with increase in temperature, and more contributes to the change quantity of the amplitude of the control command signal. For this reason, when deterioration in heat dissipation characteristics occurs in the target arm, the temperature increase quantity of the target arm with deterioration in heat dissipation characteristics significantly contributes to the change quantity of the amplitude of the control command signal, and the evaluation value widely increases.

By contrast, the other transistors Tr2 to Tr4 have small change quantity in the on-resistance with increase in temperature, and less contributes to the change quantity of the amplitude of the control command signal. For this reason, when deterioration in heat dissipation characteristics occurs in any arm other than the target arm, the temperature increase quantity of the arm other than the target arm with deterioration in heat dissipation characteristics does not significantly contribute to the change quantity of the amplitude of the control command signal, and the evaluation value hardly increases.

As described above, the evaluation value may widely increase, when the heat dissipation characteristics of the target arm deteriorates. Accordingly, the deterioration detection unit 70 is enabled to detect deterioration in heat dissipation characteristics of the target arm, by monitoring change in the value $|\Delta L1 (T0)-\Delta H1 (T0)|$ serving as the evaluation value.

FIG. 10 is a diagram to explain the operation of determining deterioration in heat dissipation characteristics in the inverter device according to the first embodiment. FIG. 10 corresponds to Step ST26 explained in FIG. 5. FIG. 10 schematically shows the state in which presence of deterioration in heat dissipation characteristics is determined, with the horizontal axis indicating the number of inspections from start of the inverter device 1, and the vertical axis indicating the evaluation value obtained in execution of inspection.

As shown in FIG. 10, the deterioration detection unit 70 stores the evaluation value calculated for the same target arm after start of the inverter device 1, in a memory (not shown) in a time-series manner. The deterioration detection unit 70 determines whether the evaluation value exceeds a predetermined threshold (referred to as "threshold Th" in FIG. 10) or not, and determines whether the target arm deteriorates in heat dissipation characteristics or not. The deterioration detection unit 70 is not limited to the operation of instantly determining whether the target arm deteriorates in heat dissipation characteristics when the evaluation value exceeds the threshold Th, but any other determination standard may be provided.

The example of FIG. 10 shows the case where the deterioration detection unit 70 determines that the target arm deteriorates in heat dissipation characteristics when the evaluation value exceeds the threshold Th twice successively. With this operation, even when the evaluation value exceeds the threshold value at the mth time, when the evaluation value becomes lower than threshold Th at the (m+1)th time, the deterioration detection unit 70 does not determine that the target arm deteriorates in heat dissipation characteristics. When the evaluation value exceeds the threshold value at the Mth time and the evaluation value exceeds threshold Th at the (M+1)th time, the deterioration detection unit 70 determines that the target arm deteriorates in heat dissipation characteristics. This operation removes the case where the evaluation value temporarily exceeds the threshold Th due to variations of inspections.

Next, a process from inspection sequence of the other arms to the operation of determining deterioration in heat dissipation characteristics in the deterioration detection mode in the inverter device according to the first embodiment will be described.

FIG. 11 is a table to explain a difference in details of setting between target arms in the inspection sequence in the inverter device according to the first embodiment. FIG. 11 corresponds to Steps ST27 and ST28 explained in FIG. 5.

As shown in FIG. 11, when the arm A1 is selected as the target arm, the combination of the arms forming the single-phase inverter includes the arms A1 to A4, as described above. When the process from the inspection sequence for the arm A1 to the operation of determining deterioration in heat dissipation characteristics (Inspection Number 1 in FIG. 11) is finished, the processes from the inspection sequence to the operation of determining deterioration in heat dissipation characteristics (Inspection Numbers 2 to 4 in FIG. 11) are successively executed for the other arms A2 to A4 in the same single-phase inverter structure as the target arms. When the processes from the inspection sequence to the operation of determining deterioration in heat dissipation characteristics (Inspection Numbers 1 to 4 in FIG. 11) are finished for all the arms A1 to A4 forming the single-phase inverter, a new combination of arms forming a single-phase inverter is determined (the arms A3 to A6 are selected in the example of FIG. 11). Thereafter, the processes from the inspection sequence to the operation of determining deterioration in heat dissipation characteristics (Inspection Numbers 5 and 6 in FIG. 11) are executed for the arms A5 and A6, for which no determination of deterioration in heat dissipation characteristics has been executed, in the new combination of the arms A3 to A6 forming the single-phase inverter.

With the operations described above, it is determined whether deterioration in heat dissipation characteristics exists, for each of all the arms A1 to A6.

It should be noted that the shape of the envelopes extracted with the deterioration detection unit 70 differ according to whether the current flowing through the target arm has a positive direction or a negative direction.

Figure 12:
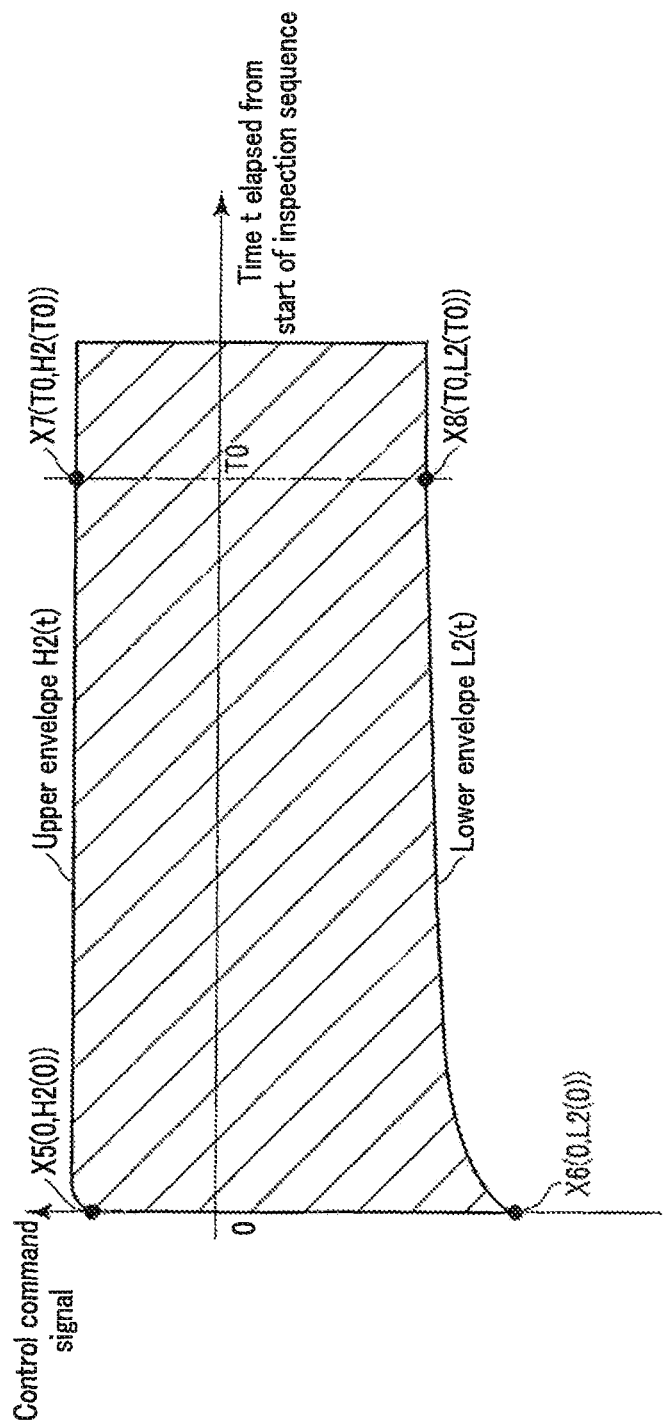
FIG. 12 is a schematic diagram to explain an envelope extraction operation in the deterioration detection mode in the inverter device according to the first embodiment.

FIG. 12 is a schematic diagram to explain the operation of extracting envelopes of the control command signal in the deterioration detection mode in the inverter device according to the first embodiment, and corresponds to FIG. 8. FIG. 8 shows the envelopes in the case where the current flowing through the target arm has a positive direction (for example, the Inspection Number 1 illustrated in FIG. 11, that is, the target arm is the arm A1), while FIG. 12 shows envelopes in the case where the current flowing through the target arm has a negative direction (for example, the Inspection Number 2 illustrated in FIG. 11, that is, the target arm is the arm A2). In the following description, FIG. 12 shows the case where the target arm is the arm A2.

As shown in FIG. 12, when the current flowing through the target arm has a negative direction, the envelopes have a shape vertically inverted from the envelopes shown in FIG. 8. Specifically, the maximum value of the amplitude of the control command signal is illustrated as an upper envelope H2 ($t$), and the minimum value is illustrated as a lower envelope L2 ($t$). The upper envelope H2 ($t$) of the control command signal transitions in a direction in which the amplitude increases from the point X5 (0, H2 (0)) at the point in time (t=0) when the inspection sequence is started, and reaches the point X7 (T0, H2 (T0)) at the time (t=T0) after a predetermined period has passed. The lower envelope L2 ($t$) transitions in a direction in which the amplitude decreases from the point X6 (0, L2 (0)) at the point in time (t=0) when the inspection sequence is started, and reaches the point X8 (T0, L2 (T0)) at the time (t=T0) after a predetermined period has passed.

Figure 13:
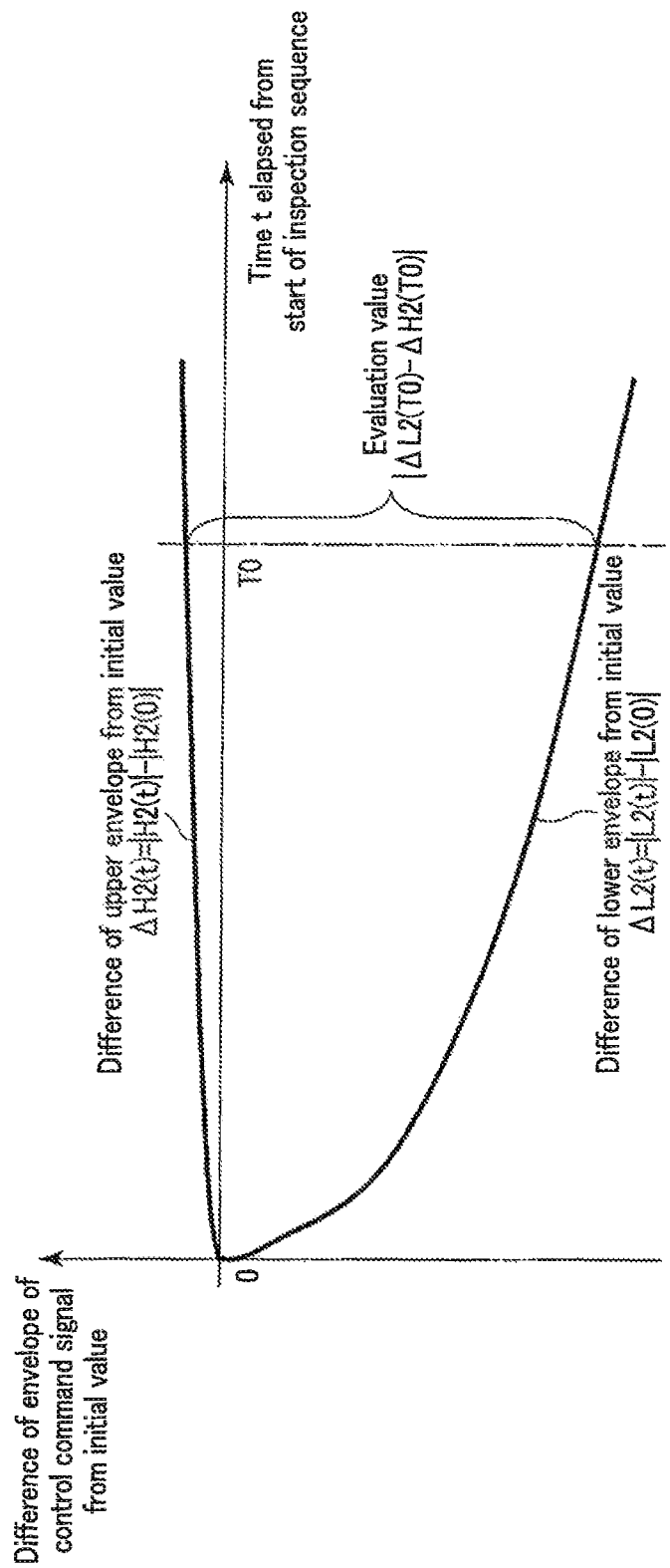
FIG. 13 is a diagram to explain an evaluation value calculation operation in the deterioration detection mode in the inverter device according to the first embodiment.

FIG. 13 is a diagram to explain the evaluation value calculation operation in the deterioration detection mode in the inverter device according to the first embodiment, and corresponds to FIG. 9. FIG. 13 shows a difference ΔL2 ($t$)=|L2 ($t$)|−|L2 (0)| of the lower envelope from the initial value, and a difference ΔH2 ($t$)=|H2 ($t$)|−|H2 (0)| of the upper envelope from the initial value.

As shown in FIG. 13, the deterioration detection unit 70 calculates the absolute value of a difference between a difference ΔL2 (T0) of the lower envelope from the initial value and a difference ΔH2 (T0) of the upper envelope from the initial value, as the evaluation value, after predetermined time T0 has passed, like shown in FIG. 12. That is, the evaluation value is expressed as |ΔL2 (T0)−ΔH2 (T0)|.

The first embodiment enables detection of deterioration in heat dissipation characteristics of the switching element, without using any new sensor. This effect will be described hereinafter.

The inverter device 1 according to the first embodiment has the deterioration detection mode in which the inverter device operates with a single-phase inverter, in addition to the normal mode in which the inverter device operates with a three-phase inverter. In the deterioration detection mode, the current feedback controller 50 feeds back the current flowing through the motor coil 30, to generate the control command signal such that a predetermined current is supplied to the motor coil 30 for a predetermined time period. In operation in the deterioration detection mode, the pulse width modulator 60 sets the level "H" to the gate voltage V1, for the pulse width modulation signals output to the three arms excluding the target arm in the arms forming the single-phase inverter. In addition, in operation in the deterioration detection mode, the pulse width modulator 60 sets the level "H" to the gate voltage V3 lower than the gate voltage V1, for the pulse width modulation signal output to the target arm in the arms forming the single-phase inverter.

MOSFETs are applied to the transistors Tr. In this manner, each of the transistors Tr has on-resistance characteristics depending on the temperature, as described in FIG. 3. Specifically, the on-resistance of each of the transistors Tr has characteristics in which the on-resistance is larger in the case where the gate voltage V3 is applied than that in the case where the gate voltage V1 is applied. In this manner, the on-resistance of the target arm is larger than the on-resistance of the arms other than the target arm. With this configuration, the current feedback controller 50 is enabled to generate a control command signal in which one (the envelope with the larger value) of the envelopes is significantly larger than the other (the envelope with the smaller value).

Each of the transistors Tr also has characteristics that the on-resistance increases with increase in temperature when the gate voltage V1 is applied, and the on-resistance decreases with increase in temperature when the gate voltage V3 smaller than the gate voltage V1 is applied. In addition, the decrease quantity in voltage drop with increase in temperature when the gate voltage V3 is applied is larger than the decrease quantity in voltage drop with increase in temperature when the gate voltage V1 is applied. In this manner, when the temperature of each of the arms increases by the current flowing through the single-phase inverter, the change quantity of the envelope with the larger value (for example, the upper envelope H1 ($t$)) is significantly larger than the change quantity of the envelope with the smaller value (for example, the lower envelope L1 ($t$)). This configuration enables the deterioration detection unit 70 to calculate the evaluation value on the basis of the value of the envelope with the larger value, by detecting the control command signal when the inverter operates as the single-phase inverter, and specify that the heat dissipation characteristics of the target arm deteriorates.

In addition, because the arm to which the gate voltage V3 is applied has a large on-resistance, the arm is enabled to generate heat with a small current. This configuration reduces the current flowing through the load in the motor coil 30 and the wire, and reduces the heat generation quantity of the load and the wire to small quantity with respect to the heat generation quantity of the target arm. This structure improves sensitivity for change of the control command signal with heat generation of the target arm.

MOSFETs using silicon carbide may be applied to the transistors Tr. This configuration enables operation with higher efficiency than that in the case of using IGBT (Insulated Gate Bipolar Transistor) or the like as the switching element.

The deterioration detection unit 70 calculates the evaluation value, on the basis of the difference (for example, ΔH1 (T0)) between the value of the envelope with the larger value and the initial value, as the evaluation value. This configuration cancels influence of change of the current sensor with lapse of time from the start of the inverter device 1 on the evaluation value.

More specifically, the deterioration detection unit 70 calculates the evaluation value, on the basis of the difference ΔH1 (T0) between the value of the envelope with the larger value and the initial value, and a difference (such as ΔL1 (T0)) between the value of the envelope with the smaller value and the initial value, as the evaluation value. That is, the deterioration detection unit 70 calculates |ΔL1 (T0)−ΔH1 (T0)|, as the evaluation value. This configuration cancels influence of change in the control command signal due to causes other than change in on-resistance with increase in temperature on the evaluation value.

The deterioration detection unit 70 determines whether the heat dissipation characteristics of the target arm deteriorates, on the basis of whether the calculated evaluation value |ΔL1 (T0)−ΔH1 (T0)| exceeds the predetermined threshold Th. This configuration enables monitoring the state in which the heat dissipation characteristics gradually deteriorate from start of the inverter device 1, and executing work of exchanging the target arm or the like, before deterioration progresses to a degree obstructing the operation of the power element 28. A crack occurring in the solder 27 slowly grows over a span of months to years. For this reason, it is unnecessary to constantly monitor deterioration in heat dissipation characteristics while the inverter device 1 operates in the normal mode, but intermittent monitoring for each periodic inspection sufficiently enables detection of deterioration before the operation of the power element 28 is obstructed.

Accordingly, the inverter device 1 according to the first embodiment enables detection of deterioration in heat dissipation characteristics of the switching element, without using any new sensor, such as a temperature sensor. This configuration suppresses increase in size due to addition of a new sensor, and contributes to miniaturization of the inverter device 1.

Second Embodiment

An inverter device according to a second embodiment will be described.

The first embodiment shows the case where one power element is provided in each of arms in the power element module, but the configuration is not limited thereto. The inverter device according to the second embodiment is different from the inverter device according to the first embodiment, in that a plurality of power elements connected in parallel are provided in each of arms in the power element module. The inverter device according to the second embodiment is, for example, applied to a giant system, such as a train, and may require flowing of a larger current. In the following description, an explanation of constituent elements and operations that are the same as those in the first embodiment will be omitted, and constituent elements and operations different from those in the first embodiment will be mainly explained.

A configuration of the power element module of the inverter device according to the second embodiment will be described.

Figure 14:
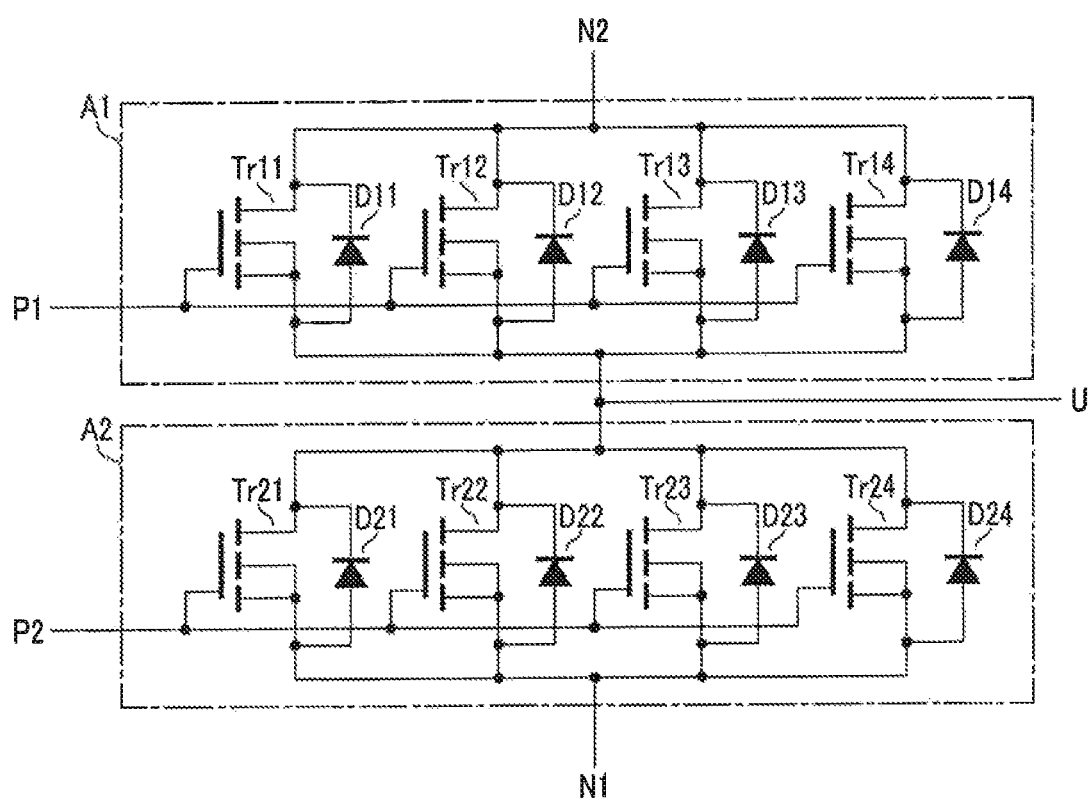
FIG. 14 is a circuit diagram to explain a configuration of a power element module of an inverter device according to a second embodiment.

FIG. 14 is a circuit diagram to explain a configuration of the power element module of the inverter device according to the second embodiment. FIG. 14 corresponds to part of the power element module 20 in FIG. 1 explained in the first embodiment. More specifically, FIG. 14 shows arms A1 and A2 in the power element module 20, as an example.

As shown in FIG. 14, the arm A1 includes transistors Tr11, Tr12, Tr13, and Tr14, and diodes D11, D12, D13, and D14. A pair of the transistor Tr11 and the diode D11, a pair of the transistor Tr12 and the diode D12, a pair of the transistor Tr13 and the diode D13, and a pair of the transistor Tr14 and the diode D14 are connected in parallel between a node N2 and a node U. Specifically, each of the transistors Tr11 to Tr14 includes a drain end connected with the node N2, a source end and a back gate connected with the node U, and a gate to which a pulse width modulation signal P1 is input from the pulse width modulator 60. Each of the diodes D11 to D14 includes an input end connected with the node U, and an output end connected with the node N2.

The arm A2 includes transistors Tr21, Tr22, Tr23, and Tr24, and diodes D21, D22, D23, and D24. A pair of the transistor Tr21 and the diode D21, a pair of the transistor Tr22 and the diode D22, a pair of the transistor Tr23 and the diode D23, and a pair of the transistor Tr24 and the diode D24 are connected in parallel between the node U and a node N1. Specifically, each of the transistors Tr21 to Tr24 includes a drain end connected with the node U, a source end and a back gate connected with the node N1, and a gate to which a pulse width modulation signal P2 is input from the pulse width modulator 60. Each of the diodes D21 to D24 includes an input end connected with the node N1, and an output end connected with the node U.

It should be noted that a pair of arms A3 and A4, and a pair of arms A5 and A6 have substantially the same configuration as that of the pair of the arms A1 and A2.

Specifically, the arm A3 includes transistors Tr31, Tr32, Tr33, and Tr34, and diodes D31, D32, D33, and D34 (not shown). A pair of the transistor Tr31 and the diode D31, a pair of the transistor Tr32 and the diode D32, a pair of the transistor Tr33 and the diode D33, and a pair of the transistor Tr34 and the diode D34 are connected in parallel between the node N2 and a node V. Specifically, each of the transistors Tr31 to Tr34 includes a drain end connected with the node N2, a source end and a back gate connected with the node V, and a gate to which a pulse width modulation signal P3 is input from the pulse width modulator 60. Each of the diodes D31 to D34 includes an input end connected with the node V, and an output end connected with the node N2.

The arm A4 includes transistors Tr41, Tr42, Tr43, and Tr44, and diodes D41, D42, D43, and D44. A pair of the transistor Tr41 and the diode D41, a pair of the transistor Tr42 and the diode D42, a pair of the transistor Tr43 and the diode D43, and a pair of the transistor Tr44 and the diode D44 are connected in parallel between the node V and the node N1. Specifically, each of the transistors Tr41 to Tr44 includes a drain end connected with the node V, a source end and a back gate connected with the node N1, and a gate to which a pulse width modulation signal P4 is input from the pulse width modulator 60. Each of the diodes D41 to D44 includes an input end connected with the node N1, and an output end connected with the node V.

The arm A5 includes transistors Tr51, Tr52, Tr53, and Tr54, and diodes D51, D52, D53, and D54. A pair of the transistor Tr51 and the diode D51, a pair of the transistor Tr52 and the diode D52, a pair of the transistor Tr53 and the diode D53, and a pair of the transistor Tr54 and the diode D54 are connected in parallel between the node N2 and a node W. Specifically, each of the transistors Tr51 to Tr54 includes a drain end connected with the node N2, a source end and a back gate connected with the node W, and a gate to which a pulse width modulation signal P5 is input from the pulse width modulator 60. Each of the diodes D51 to D54 includes an input end connected with the node W, and an output end connected with the node N2.

The arm A6 includes transistors Tr61, Tr62, Tr63, and Tr64, and diodes D61, D62, D63, and D64. A pair of the transistor Tr61 and the diode D61, a pair of the transistor Tr62 and the diode D62, a pair of the transistor Tr63 and the diode D63, and a pair of the transistor Tr64 and the diode D64 are connected in parallel between the node W and the node N1. Specifically, each of the transistors Tr61 to Tr64 includes a drain end connected with the node W, a source end and a back gate connected with the node N1, and a gate to which a pulse width modulation signal P6 is input from the pulse width modulator 60. Each of the diodes D61 to D64 includes an input end connected with the node N1, and an output end connected with the node W.

The configuration described above enables distribution of a large current with a plurality of transistors connected in parallel in the same arm, even when a flowing of a large current is required in the normal mode. It should be noted that the example of FIG. 14 shows the case where the number of transistors connected in parallel is 4, but the configuration is not limited thereto, and transistors of a desired number may be connected in parallel.

Generally, when the number of transistors connected in parallel in the same arm increase, the change quantity of the amplitude of the control command signal due to deterioration in heat dissipation characteristics of one of the transistors decreases. This is because the change quantity of the on-resistance of the whole arms is smaller in the case where temperature of one of transistors connected in parallel increases than that in the case where temperature of one transistor that is not connected in parallel increases. For this reason, when a plurality of transistors are connected in parallel in the same arm, there is the possibility that determination of presence of deterioration in heat dissipation characteristics on the basis of the evaluation value becomes impossible, due to decrease in the change quantity of the amplitude of the control command signal.

However, according to the second embodiment, in the same manner as the first embodiment, the pulse width modulator 60 sets the level "H" to the gate voltage V1, for the pulse width modulation signals output to the three arms excluding the target arm in the arms forming the single-phase inverter, when the inverter operates in the deterioration detection mode. In addition, the pulse width modulator 60 sets the level "H" to the gate voltage V3 lower than the gate voltage V1, for the pulse width modulation signal output to the target arm in the arms forming the single-phase inverter, when the inverter operates in the deterioration detection mode. The on-resistance of the arm to which the gate voltage V1 is applied increases with increase in temperature, and the on-resistances of the arms to which the gate voltage V3 is applied decrease with increase in temperature.

In this manner, in the case where the heat dissipation characteristics of any transistor in the target arm deteriorates (hereinafter, the transistor will be referred to as "deteriorating transistor", and the other transistors in the target arm will be referred to as "non-deteriorating transistors", for the sake of convenience), the temperature of the deteriorating transistor increases more than that of the other non-deteriorating transistors, and the on-resistance of the deteriorating transistor decreases more. For this reason, the current flowing through the deteriorating transistor in the target arm is larger than the current flowing through the other non-deteriorating transistors. As a result, the temperature of the deteriorating transistor further increases, and the on-resistance thereof further decreases.

As described above, the deteriorating transistor repeats increase in temperature and decrease in on-resistance in a chain reaction, to increase influence of change in on-resistance of the deteriorating transistor on the current control system.

Accordingly, the second embodiment increases change in amplitude of the control command signal even in the case where a plurality of transistors are connected in parallel in the same arm, and consequently enables detection of deterioration in heat dissipation characteristics of the switching element without using any new sensor.

The inverter devices according to the first embodiment and the second embodiment described above are not limited to the examples described above, but various modifications may be applied.

(First Modification)

As described above, in the normal mode in the first embodiment and the second embodiment (in particular, in the second embodiment), when the inverter device 1 is applied to a giant system, such as a train, the inverter device 1 requires flowing of a large current. With this requirement, the power supply 10 may have a very high voltage of 1000 V or more. In such a case, the change quantity of the source-drain voltage $V_{DS}$ caused by change in on-resistance is very small in comparison with the magnitude of the voltage of the power supply 10. This configuration reduces the change quantity of the amplitude of the control command signal due to change in on-resistance with respect to the magnitude of the amplitude of the control command signal, and may cause difficulty in detection of deterioration in heat dissipation characteristics.

The following measure may be applied to the inverter device 1 according to a first modification, for the purpose of improving the sensitivity for change in amplitude of the control command signal due to change in on-resistance.

First, when the inverter device 1 operates in the deterioration detection mode, the magnitude of the voltage of the power supply 10 is reduced to be smaller than that in the normal mode. This configuration increases the ratio of the change quantity of the amplitude of the control command signal due to change in on-resistance to the magnitude of the amplitude of the control command signal.

In addition, the pulse width modulator 60 reduces the frequency of the triangular wave to be smaller than that in the normal mode, in operation in the deterioration detection mode. The pulse width modulator 60 also increases the amplitude of the triangular wave to be larger than that in the normal mode, to achieve the time resolution substantially equal to that in the normal mode. This configuration enables reduction in apparent gain of the control target, while maintaining the time resolution for the pulse width modulation signal substantially equal to the time resolution in the normal mode.

In addition, the pulse width modulator 60 further increases the amplitude of the triangular wave more than that in the measure described above, in operation in the deterioration detection mode. This structure improves the time resolution for the pulse width modulation signal more than that in the normal mode, and further reduces the apparent gain of the control target.

Accordingly, this configuration increases the change quantity of the amplitude of the control command signal due to change in on-resistance with respect to the magnitude of the amplitude of the control command signal, and enables detection of deterioration in heat dissipation characteristics, even in the case where the power element module 20 is connected with a high-voltage power supply 10 as in a train.

(Second Modification)

The second embodiment described above shows the case where the same pulse width modulation signal is input to each of gates of a plurality of transistors connected in parallel in the same arm, but the configuration is not limited thereto.

A second modification may have a configuration in which different pulse width modulation signals are separately input to each of gates of a plurality of transistors connected in parallel in the same arm. This configuration restricts the transistor to which the gate voltage V3 is applied in the target arm to one transistor in the target arm. This configuration enables specification of the transistor, in which deterioration in heat dissipation characteristics occurs, in the target arm.

Some embodiments of the present invention have been described above, but these embodiments are presented as examples, and are not aimed at limiting the scope of the invention. These embodiments may be carried out in other various forms, and various omissions, replacement, and changes may be performed within a range not departing from the gist of the invention. These embodiments and modifications thereof are included in the scope and the gist of the invention, and also included in the inventions recited in the claims and a range equivalent to them.

What is claimed is:

1. An inverter device comprising:
a first switching element electrically connected between a first node and a second node;
a second switching element electrically connected between a third node and the second node;
a third switching element electrically connected between the first node and a fourth node;
a fourth switching element electrically connected between the third node and the fourth node;
a current feedback controller configured to output a control command signal to control an on or off timing of the first to the fourth switching elements on the basis of a current signal indicating a current flowing through the second node or the fourth node;
a pulse width modulator configured to be capable of switching an on or off state of each of the first to the fourth switching elements on the basis of the control command signal; and
a detection unit configured to detect heat dissipation characteristics of each of the first to the fourth switching elements on the basis of the control command signal,
wherein, when the detection unit detects the heat dissipation characteristics of each of the first to the fourth switching elements, the pulse width modulator applies a first voltage to one of the first to the fourth switching elements at a time when the one of the first to the fourth switching elements is set to the on state, and applies a second voltage larger than the first voltage to other three of the first to the fourth switching elements at a time when the other three of the first to the fourth switching elements are set to the on state.

2. The device of claim 1, wherein the pulse width modulator is configured to switch the on or off state of each of the first to the fourth switching elements by generating first to fourth pulse width modulation signals.

3. The device of claim 1, wherein the detection unit is configured to detect the heat dissipation characteristics of the switching element to which the first voltage is input on the basis of the control command signal.

4. The device of claim 1, wherein the detection unit is configured to:
extract an upper envelope and a lower envelope of the control command signal, and
detect the heat dissipation characteristics of the switching element to which the first voltage is input on the basis of a difference between a value of the upper envelope and a value of the lower envelope after a predetermined time period has passed.

5. The device of claim 4, wherein the detection unit is configured to detect the heat dissipation characteristics of the switching element to which the first voltage is input on the basis of whether the difference exceeds a predetermined threshold.

6. The device of claim 1, further comprising:
a fifth switching element electrically connected between the first node and a fifth node; and
a sixth switching element electrically connected between the third node and the fifth, node;
wherein the pulse width modulator is configured to switch the fifth switching element and the sixth switching element to an off state when the heat dissipation characteristics of each of the first to the fourth switching elements is detected.

7. The device of claim 6, wherein
an on-resistance of each of the first to the sixth switching elements decreases with an increase in temperature when each of the first to the sixth switching elements is switched to the on state with the first voltage, and
increases with an increase in temperature when each of the first to the sixth switching elements is switched to the on state with the second voltage.

8. The device of claim 7, wherein
each of the first to the sixth switching elements includes a plurality of field effect transistors connected in parallel.

9. The device of claim 8, wherein
each of the field effect transistors includes silicon carbide (SiC).

10. An inverter device configured to be capable of switching an on or off state of each of a plurality of switching elements on the basis of a control command signal, and be operable as a single-phase inverter, comprising:
a pulse width modulator configured to apply a first voltage to one of the switching elements at a time when the one of the switching elements is set to the on state, and apply a second voltage larger than the first voltage to other three of the switching elements at a time when the other three of the switching elements are set to the on state when the inverter device operates as the single-phase inverter; and
a detection unit configured to detect the control command signal when the inverter device operates as the single-phase inverter.

11. The device of claim 10, wherein the detection unit is configured to:
extract an upper envelope and a lower envelope of the control command signal, and detect heat dissipation characteristics of the one of the switching elements to which the first voltage is input on the basis of a difference between a value of the upper envelope and a value of the lower envelope after a predetermined time period has passed.

12. The device of claim 11, wherein
the detection unit is configured to detect the heat dissipation characteristics of the switching element to which the first voltage is input on the basis of whether the difference exceeds a predetermined threshold.

13. The device of claim 10, wherein
an on-resistance of each of the switching elements decreases with an increase in temperature when each of the switching elements is switched to the on state with the first voltage, and increases with an increase in temperature when each of the switching elements is switched to the on state with the second voltage.

14. The device of claim 13, wherein
each of the switching elements includes a plurality of field effect transistors connected in parallel.

15. The device of claim 14, wherein
each of the field effect transistors includes silicon carbide (SiC).

16. A method for detecting heat dissipation characteristics executed with an inverter device configured to be capable of switching an on or off state of each of a plurality of switching elements with a plurality of pulse width modulation signals generated on the basis of a control command signal generated on the basis of a current flowing through a motor coil, the inverter device configured to be operable as a single-phase inverter, comprising:
when the inverter device operates as the single-phase inverter,
setting one of the pulse width modulation signals to a first voltage when one of the switching elements is set to the on state, and setting other pulse width modulation signals to a second voltage larger than the first voltage when other switching elements are set to the on state; and detecting the heat dissipation characteristics of the switching element to which the first voltage is applied on the basis the control command signal.

17. The method of claim 16, wherein
an on-resistance of each of the switching elements decreases with an increase in temperature when each of the switching elements is switched to the on state with the first voltage, and increases with an increase in temperature when each of the switching elements is switched to the on state with the second voltage.

18. The method of claim 16, wherein
the detecting includes:
extracting an upper envelope and a lower envelope of the control command signal; and detecting the heat dissipation characteristics of the switching element to which the first voltage is input on the basis of a difference between a value of the upper envelope and a value of the lower envelope after a predetermined time period has passed.

19. The method of claim 18, wherein
the detecting includes detecting the heat dissipation characteristics of the switching element to which the first voltage is input on the basis of whether the difference exceeds a predetermined threshold.

* * * * *